United States Patent [19]
Kumakura et al.

[11] Patent Number: 6,114,751
[45] Date of Patent: Sep. 5, 2000

[54] SEMICONDUCTOR DEVICE AND ELECTRONIC DEVICE

[75] Inventors: Toyohiko Kumakura; Gen Murakami; Tomo Yasuda, all of Ibaraki, Japan

[73] Assignee: Hitachi Cable, Ltd., Tokyo, Japan

[21] Appl. No.: 09/227,573

[22] Filed: Jan. 8, 1999

[30] Foreign Application Priority Data

Jan. 8, 1998 [JP] Japan .................. 10-002214

[51] Int. Cl.⁷ .................................................. H01L 23/495
[52] U.S. Cl. ............................................. 257/666; 257/692
[58] Field of Search .................................... 257/666, 693, 257/695, 696, 692, 766

[56] References Cited

U.S. PATENT DOCUMENTS 5,473,188  5/1995  Ando .
5,569,964  10/1996  Ikebe et al. .
5,903,443  5/1999  Schoenfeld et al. .

OTHER PUBLICATIONS

"Effects of Floating Planes in Three–Dimensional Packaging Structures on Simultaneous Switching Noise", by Loizos Vakanas, et al., 1997 Electronic Copmponents and Technology Conference, pp. 826–831.

"Direct Rambus, 400 MHz", NIKKEI Electronics 1997, No. 701, pp. 31–32.

*Primary Examiner*—Sheila V. Clark
*Attorney, Agent, or Firm*—McDermott, Will & Emery

[57] ABSTRACT

It is an object of the invention to reduce noise superposed on a driving voltage of a semiconductor device and a clock signal on a transmission line. It is a further object of the invention to equalize transmission distances of signal lines in a transmission line provided between the semiconductor devices. It is a still further object of the invention to provide a electronic device, which composed of a microprocessor unit, a semiconductor device—controlling equipment and plural semiconductor devices according to the invention, each being mounted on a printed circuit board having plural bus channel lines with an equal transmission distance. In the semiconductor device of LOC structure, the leads in the outside of the package positioned at the left side and those at the right side are shifted from each other by a half pitch of the leads. A metallic film for shielding a semiconductor chip from electromagnetic wave is set close to leads.

13 Claims, 17 Drawing Sheets

SEMICONDUCTOR DEVICE AND ELECTRONIC DEVICE

FIELD OF THE INVENTION

The invention relates to a semiconductor device of lead on chip (LOC) type and an electronic device using the same, and especially to an effective technology for mounting a semiconductor device for high bit rate data processing on a printed circuit board.

BACKGROUND OF THE INVENTION

In a conventional personal computer system, a micro processor unit (MPU), a memory controller and a connector are mounted on a printed circuit board serving as a mother board, and a memory module, which is composed of plural dynamic random access memories (DRAMs) mounted on the printed circuit board, is inserted into the connector.

Each semiconductor chip forming a DRAM is packaged and transformed into the semiconductor device, which can be mounted on the printed circuit board, and the semiconductor device, so called the package, is mounted on the memory module printed circuit board, which is joined with the other printed circuit board serving as the mother board by means of the connector. In case that structural elements are mounted, the intervals of the adjacent conductors in various joining portions are in the order of sub micron meter in a semiconductor chip, 1000 μm in the package, 500 μm in joining portion in a printed circuit board and 1,270 μm in joining by means of a connector. As mentioned in the above, each joining portion copes with demand by enlarging its dimension.

In case that high bit rate transmission with a clock signal of more than 500 MHZ, such as picture transmission, inequality in lengths of signal or control lines in a transmission line cannot be neglected, and noise is apt to superpose on a driving voltage and a clock signal on the signal line, as the length of the transmission line increases. Especially, the signal line is straight or bent in the transmission line on a mounting surface thereof, and inequality in the lengths of the signal lines is inevitable. Since the delay time of the signal is closely related to the length of the signal line, the signals simultaneously transmitting through the same transmission line reach the input terminals of a semiconductor chip at different times, because or inequality in the lengths of the signal lines. In such a case, timing of the operations of the transistors is disordered, which may cause the miss operations of the semiconductor chip.

Table 1 shows levels of mounting and joining technologies of a DRAM in a personal computer. In table 1, the level of processing technology of a semiconductor chip is regarded as "1" as a standard of comparison. In mounting process in a package, since easiness of mounting is regarded as important, the dimension of a joining portion is apt to be enlarged, hence an effect if electromagnetic wave incident thereon cannot be disregarded especially in case of a semiconductor device for high bit rate data processing.

TABLE 1

LEVELS OF MOUNTING AND JOINING
TECHNOLOGY OF DRAM IN PERSONAL COMPUTOR

| | ITEMS | APPLIED TECHNOLOGY | WIRING PITCH (μm) | MAGNIFI-CATION |
|---|---|---|---|---|
| 1 | MPU MEMORY CONTROLLER | FINE PROCESSING OF WAFER | 0.5 | 1 |
| 2 | CHIP-PACKAGE JOINING | WIRE BONDING | 100 | 200 |
| 3 | PACKAGE-PRINTED CIRCUIT BOARD JOINING | SOLDER RE-FLOW | 500 | 1000 |
| 4 | PRINTED CIRCUIT BOARD-CONNECTOR JOINING | PIN-SOLDER JOINING IN APERTURE IN PRINTED CIRCUIT BOARD | 1270 | 2520 |
| 5 | CONNECTOR-MEMORY BOARD JOINING | PLUG INSERTION INTO PIN CONNECTOR | 1270 | 2520 |
| 6 | MEMORY BOARD-PKG JOINING | SOLDER BALL JOINING | 750 | 1500 |
| 7 | PKG-CHIP JOINING | Cu-Pb DIRECT JOINING | 100 | 200 |
| 8 | HIGH SPEED MEMORY CHIP | MOST ADVANCED FINE PROCESSING TECHNOLOGY OF WAFER | 0.25 | 0.5 |

In data and signal transmission between memories and a memory controller, it is indispensable to suppress noise. As mean for suppressing noise in data transmission between the memory controller and the memories, a rambus channel developed by Rambus Inc. is reported on Nikkei Electronics, p.31 to 32, No. 701, October, 1997. It is effective to directly mount a memory chip on the rambus channel in a way of face down as a method for making a wiring length of a package be zero.

In this case, however, although it is necessary to remove unacceptable chips in advance in accordance with aging, it is impossible on the basis of present technology level. Accordingly, a CSP (Chip Size Package) called a micro BGA (Ball Grid Array) is used as a small-sized package. This package is joined with a printed circuit board via solder balls. In this package, a wiring pattern, which is obtained by etching a Cu film stuck to a polyimide film, is used as means for electrically connecting bonding pads of a semiconductor chip with ball pads of the solder balls. In packages of all kinds, considerable process of fabrication is necessary, and material cost thereof becomes high.

SUMMARY OF THE INVENTION

Accordingly, it is an object of the invention to provide a semiconductor device, in which a wiring length in a package of a semiconductor device can be shortened.

It is a further object of the invention to provide an electronic device mounting plural semiconductor devices thereon, in which transmission delay times of signal lines in a transmission line provided between the semiconductor devices are equal to each other.

According to the first feature of the invention, a semiconductor device comprises:

A semiconductor chips; and leads provided on the semiconductor chip to be connected to pads of the semiconductor chip;

wherein the leads comprises left and right side leads, such that the left side leads are arranged to be staggered relative to the right side leads by a half pitch of the left and right side leads.

According to the second feature of the invention, an electronic device comprises:

a bus channel line board having a plurality of parallel and straight bus channel lines, each having a same length; and semiconductor devices provided on the bus channel line board;

wherein each of the semiconductor devices has leads connected to the parallel and straight bus channel lines, the leads extending in opposite directions in a staggered pattern by a half pitch of the leads.

BRIEF DESCRIPTION OF THE DRAWINGS

The invention will be explained in more detail in conjunction with appended drawings, wherein.

DESCRIPTION OF THE PREFERRED EMBODIMENT

Figure 1:
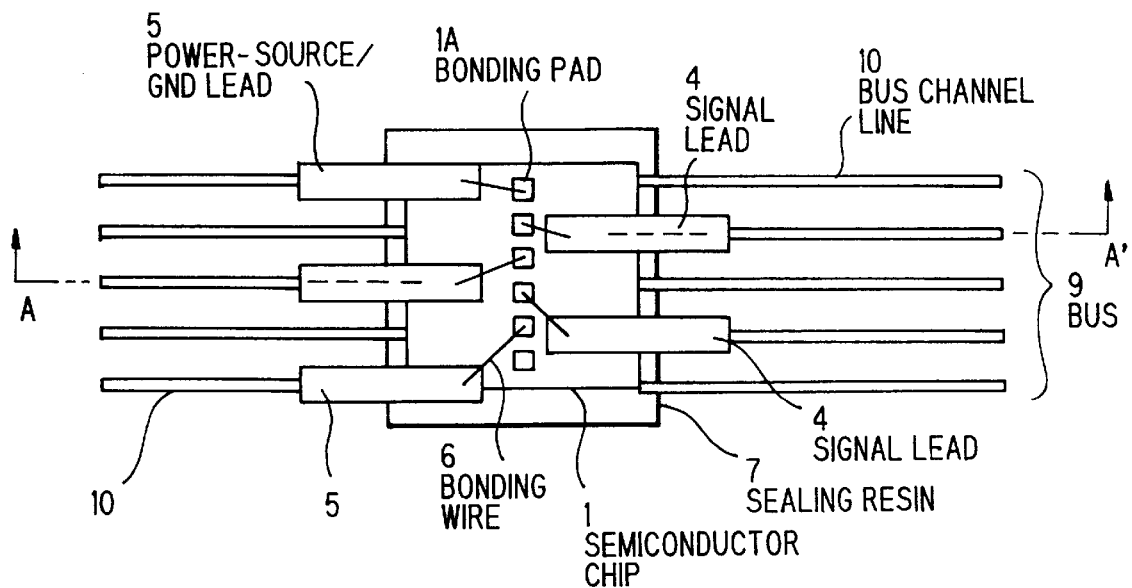
FIG. 1 is a planar view for showing an outline of the structure of a DRAM of LOC structure according to the first preferred embodiment of the invention.

Thereafter, preferred embodiments of the invention will be explained referring to the appended drawings.

Structural elements with the same function will be represented by the same reference numeral throughout all the appended drawings, and repeated explanation will be omitted.

(The first preferred embodiment)

Figure 2:
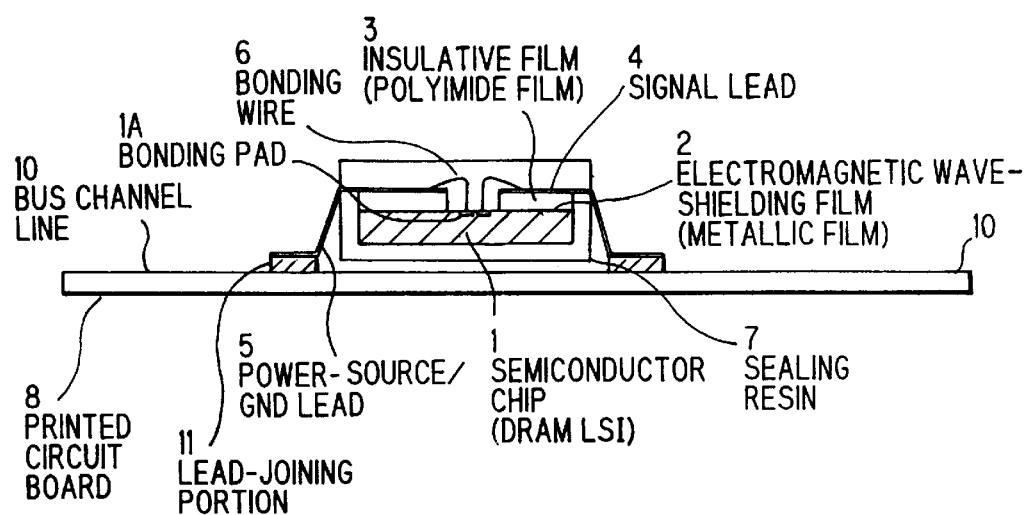
FIG. 2 is a cross-sectional view of FIG. 1 in A–A' cross-section.

FIG. 1 is a planar view for showing an outline of a structure of a DRAM of LOC (Lead On Chip) structure as the first preferred embodiment of the invention. FIG. 2 is a cross-sectional view of FIG. 1 in a A–A' cross-section, and FIG. 3 is a planar view for showing a joining portion of a printed circuit board.

Figure 3:
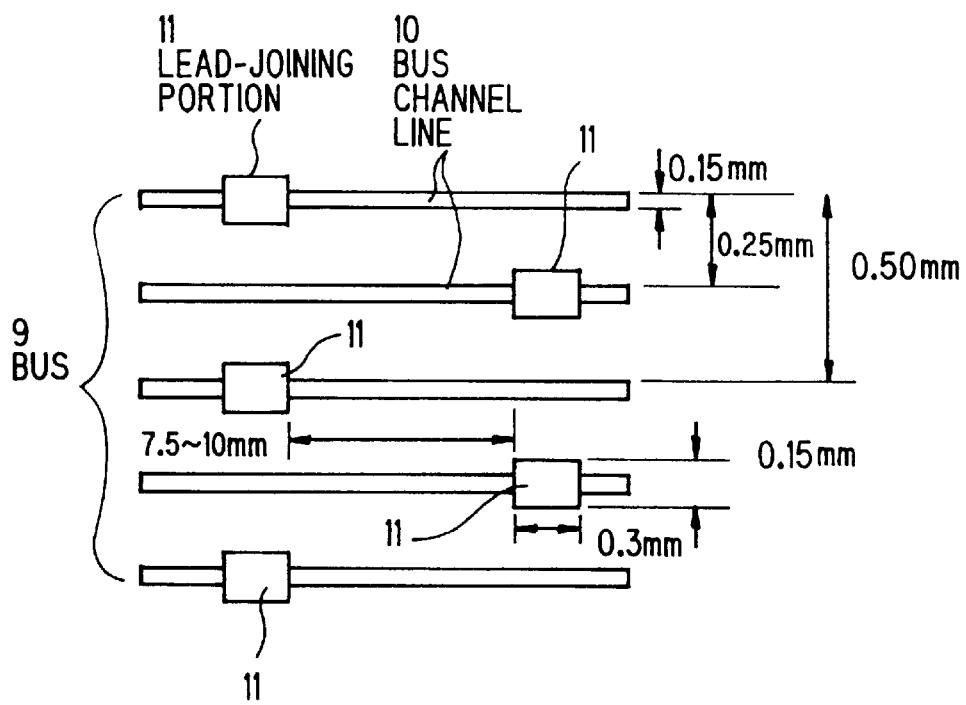
FIG. 3 is a planar view for showing a joining portion between a DRAM and a printed circuit board according to the first preferred embodiment.

In FIGS. 1 to 3, 1 is a semiconductor chip (LSI of DRAM), 1A is a bonding pad of the semiconductor chip 1, 2 is a electromagnetic shielding film (a metallic film), 3 is an insulative film with thermoplastic adhesive for joining (polyimide), 4 is a lead for a signal, 5 is a lead for power source/GND, 6 is a bonding wire (a Au wire), 7 is sealing resin, 8 is a printed circuit board including a multilayered printed circuit board, 9 is a bus composed of plural bus channel lines with an equal length formed on the printed circuit board 8, 10 is a bus channel line for transmitting a memory-driving voltage or a clock signal, and 11 is a lead-joining portion formed on a bus channel line 10 in the bus 9.

As shown in FIGS. 1 and 2, the main surface of the semiconductor chip 1 is covered with the metallic film 2 except a region, on which bonding pads 1A are provided, and the insulative film (the polyimide film) 3 is formed on the metallic film 2. On the insulative film, the signal lead 4 and the power source/GND lead 5 are respectively shifted in the right and left directions.

The bonding pads 1A are electrically connected with the signal lead 4 and the power source/GND lead 5 by the bonding wires 6, and all of them are sealed by sealing resin 7.

In the outside of the package, the positions of the leads on the left and right sides are shifted from each other by a half pitch of the bus channel lines in the lateral direction. Accordingly, the leads on the left and right sides are alternately connected with the bus channel lines 10. Moreover, the power source/GND lead 5 and the signal lead 4 are respectively mounted on the left and right sides on the printed circuit board 8. At the time of fabrication of the LOC structure, the metallic film 2 lies between the insulative film (the polyimide film) 3 with thermoplastic adhesive and the semiconductor chip 1.

As shown in FIG. 3, the printed circuit board 8 is provided with the bus 9. The lead joining portion 11 is formed on the bus channel line 10 of the bus 9.

The bus channel lines 10 having an equal transmission length are provided on the printed circuit boards 8 with a certain lateral pitch, which is the minimum value designed by economical consideration. For the convenience of explanation, the interval of the adjacent bus channel lines is assumed to be 0.25 mm.

The signal bus channel line is positioned between the power source and GND bus channel lines. A pitch of the power source and GND bus channel lines is 0.25 mm×2=0.5 mm. 0.5 mm is the minimum pitch, at which re-flow mounting method is applicable according to the technology in 1997. The re-flow mounting method at this pitch shows high actual results in Quad Flat Package.

As mentioned in the above, since the positions of the leads on the left and right sides in the outside of the package are shifted by a half pitch from each other, each lead joining-portion 11 can be easily secure an area therearound and the area occupied by the lead can be reduced, so that the semiconductor device can be small-sized.

A package containing a semiconductor chip 1 therein is electrically connected with the lead joining portion 11 on the bus 9 on the printed circuit board 8. The lead joining portion 11 is formed as follows. A hole with a predetermined diameter is made on a insulative film, such as photosensitive polyimide film, formed on the bus channel line 10 (a 18 $\mu$m thick Cu film) by means of photolithography, and the bus channel line is exposed and a 1 to 10 $\mu$m thick Sn plated layer is formed thereon.

The width of the leads 4 and 5 of the package of the semiconductor chip 1 to be electrically connected with the bus channel lines are made to be nearly the same as that of the bus channel line 10. In case that the pitch of the bus channel lines 10 is 0.25 mm and the width thereof is 0.15 mm, the clearance between the adjacent bus channel lines is 0.1 mm, so that the width of the lead should be about 0.1 mm.

Material of the lead frame forming the leads 4 and 5 of the package is a metallic plate (42 alloy or Cu alloy) with a thickness less than 0.1 mm. The lead frame is formed from the metallic plate by the method of etching or pressing into a predetermined shape. On the portion of the lead frame to be joined with the semiconductor chip 1, a 2 to 10 $\mu$m thick Ag plated film is formed.

An insulative film with heat-resisting property and low dielectric constant, such as thermoplastic polyimide, is stuck to the surface of the lead frame to be joined with the semiconductor chip, which is so called pre-taped LOC structure.

Aforementioned insulative material for the lead frame of a DRAM of LOC structure is a polyimide film, to which thermoplastic polyimide is applied. However in the electronic device used for high bit rate transmission, electromagnetic noise radiated from other electronic equipment or a semiconductor chip in the same personal computer is apt to induce a noise current, which is transmitted along the bus channel line, such as a signal line or a power source line. Then, in the aforementioned polyimide film stuck to the lead frame, a metallic film 2 is previously stuck to a surface of the polyimide film, which opposes to the lead frame. According to the structure, since the metallic film 2 lies under the signal and power source leads, external radiation of electromagnetic wave can be suppressed.

The semiconductor chip 1 is stuck to the lead frame of LOC structure, and the semiconductor chip 1 is electrically connected with the leads 4 and 5 of the lead frame by bonding wires (Au wires) 6. Thereafter, the external shape of the package is formed by means of transfer mold technology. Then, the lead appearing in the outside of the package is transformed into a shape for reducing thermal stress, such as gull-wing, J or S shape, by metallic mold, and the leads of the package to be joined by soldering are completed. The leads 4 and 5 are soldered to the joining portions 11 on the bus channel lines 10 in the bus 9.

The effect of electromagnetic wave is further reduced by adopting a new sealing method in stead of transfer mold technology. The new sealing method is as follows. After the lead frame of LOC structure is stuck to the semiconductor chip 1 and wire bonding by Au wires 6 is over, a member, which is obtained by applying liquid undertill material to a carrier tape (thermoplastic polyimide and B stage epoxy resin) is stuck to the metallic film 2. According to this method, the effect of external electromagnetic wave incident on the device can be more effectively shielded.

Figure 4A:
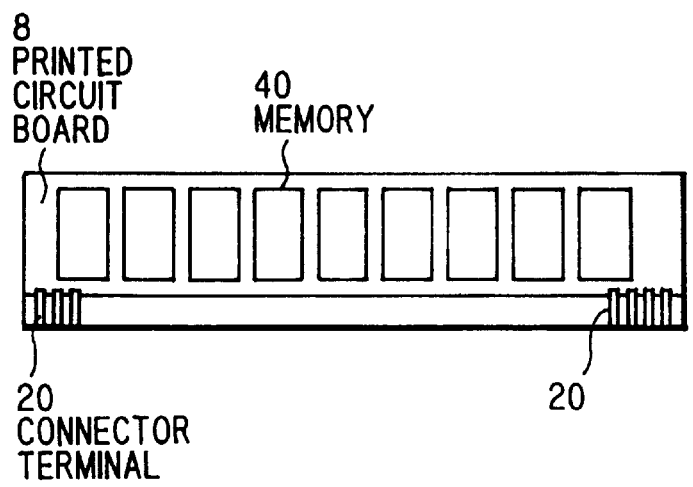
FIGS. 4A and 4B show states that memories according to the first preferred embodiment of the invention are mounted on printed circuit boards.
Figure 4B:
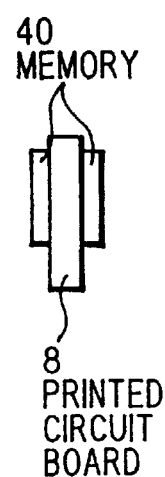

In case that a flexible printed circuit board for mounting the aforementioned packages is adopted, at least two memory devices are mounted on a memory bus, which is composed of bus channel lines arranged in parallel with each other with a lateral pitch of 0.25 mm. As shown in FIG. 4A (a planar view) and FIG. 4B (a side view), in a case of a memory module, 8 to 9 memories 40 according to the invention are mounted on one surface of the printed circuit board, and 16 to 18 memories on both the surface. In case that 64 M DRAMs are mounted, the memory capacity is 64 MB or 72 MB for one surface, and 128 MB or 1.42 MB for both surfaces.

Figure 5A:
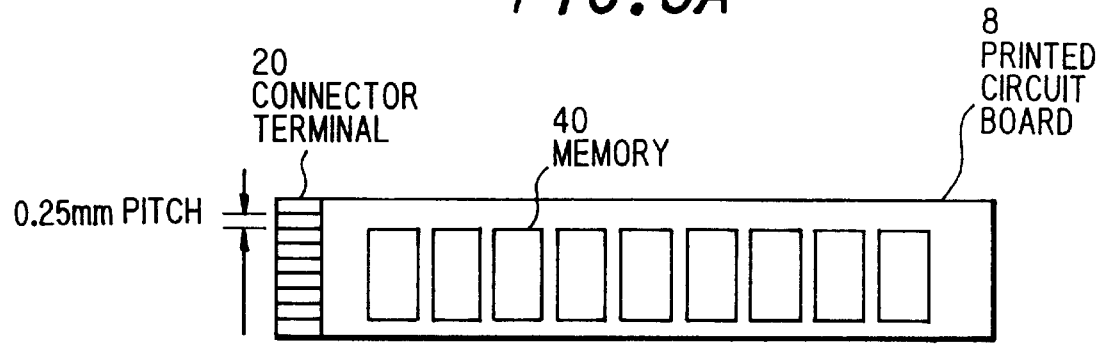
FIGS. 5A and 5B show another way for mounting the memories according to the first preferred embodiment of the invention on the printed circuit boards.
Figure 5B:
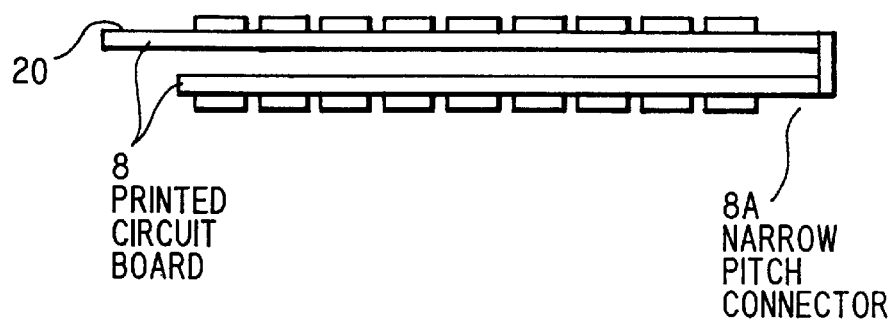

In case that a flexible printed circuit board is adopted, the 18 memories 40 according to the invention are mounted on one surface of the flexible printed circuit board 8 at the maximum, and as shown in FIG. 5B, the flexible printed circuit board is bent by 180° at the middle portion 8A thereof (enclosed in a circle).

According to this method, since the number of through holes can be decreased, and the flexible tape can be easily fabricated.

The input and output portions of the printed circuit board 8 mounting the LSI packages thereon are joined by a connector terminal 20. In this case, it is advisable to use a narrow pitch connector 8A for the flexible printed circuit board in stead of a plug in connector and shorten the length of wiring of the connecting portion of the connector terminal 20. The lateral pitch of the bus channel lines on the flexible printed circuit board is 0.25 mm as shown in FIG. 5A.

It is more effective for suppressing noise to directly mount a memory-controller IC and a MPU device on the memory bus in addition to the memory devices.

Figure 6:
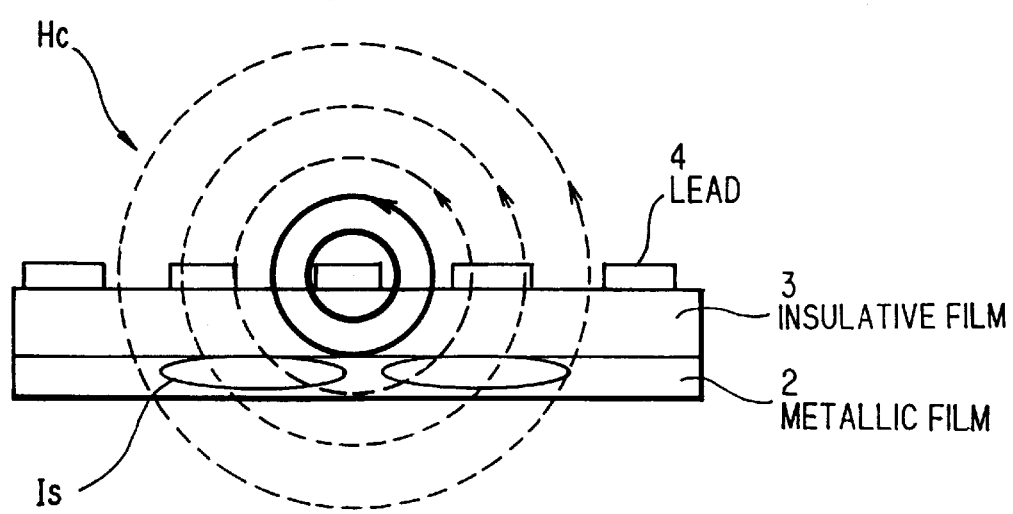
FIG. 6 shows a magnetic field generated by a current on a lead of the DRAM according to the first preferred embodiment of the invention.
Figure 7:
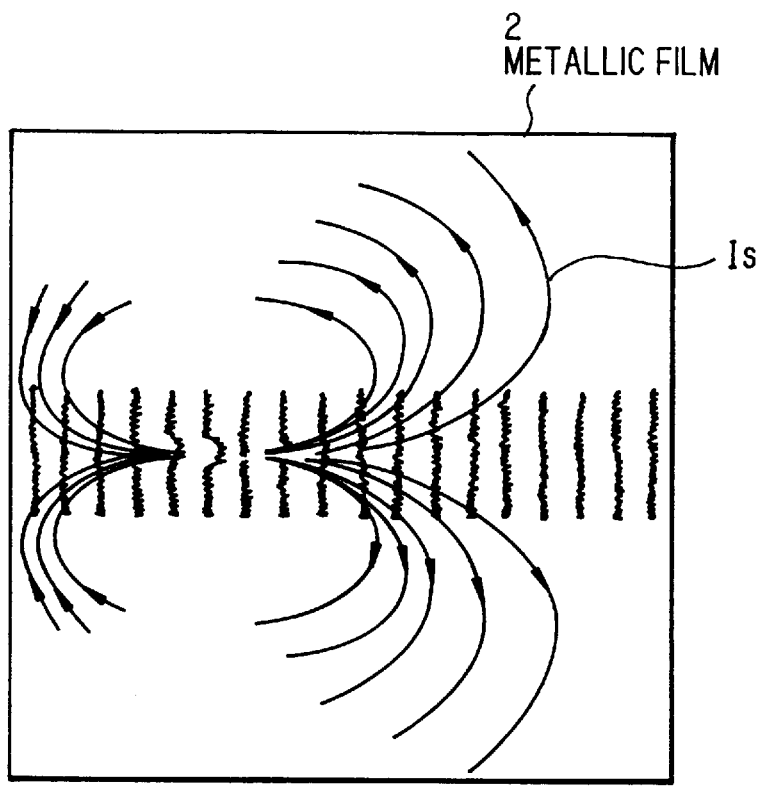
FIG. 7 shows an eddy current distribution on a metallic film set close to the lead obtained by computer simulation.

As shown in FIG. 6, a magnetic circuit shown by an arrow is generated by an electric current on the lead (a signal line) 4, and a magnetic flux corresponding to a permeability of medium including a metallic film 2 is generated. In case that there is no ferromagnetic substance in the circumference, the specific permeability is regarded as 1. As shown in FIG. 7, an eddy current arises on the surface of the metallic film 2 in a direction to decrease the magnetic flux, and thereby the magnetic flux density is decreased. A following relation given by equation (1) holds between the signal current on the lead 4, the magnetic flux in the circumference and the eddy current Is in the metallic film 2.

$$Is \, \sigma \times d\phi/dt \qquad (1)$$

In the equation (1), Is is the eddy current, σ is an electric conductivity of the metallic film 2, φ is the magnetic flux ($=\int\int B\cdot ndS = \mu o \int\int H\cdot ndS$). B is the magnetic flux density, n is a unit vector in the normal direction, H is a magnetic field ($\int cH\cdot ds = I$) and I is a signal current on a signal line.

According to the equation (1), the following characteristics (A) to (D) become clear.

Figure 8:
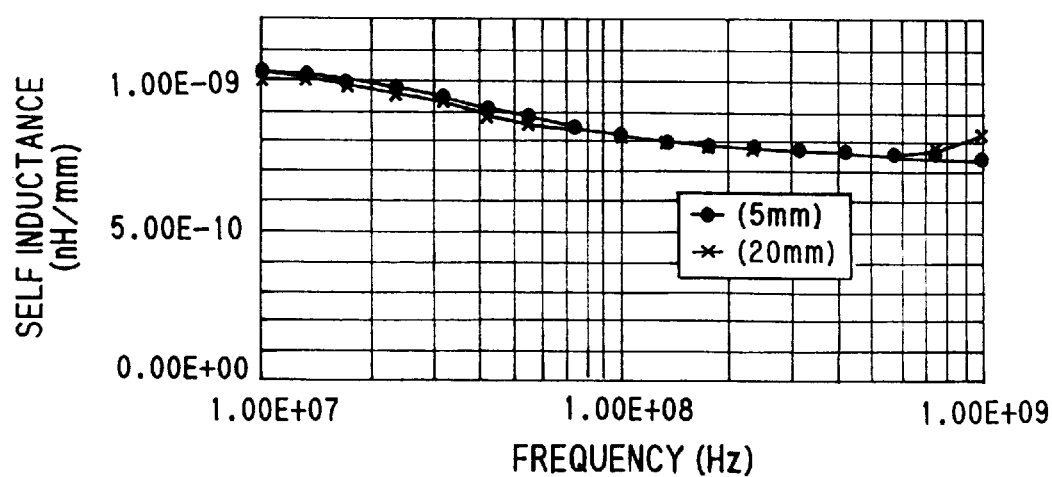
FIG. 8 shows measured inductances of the lead in a frequency range of 10 MHz to 1000 MHz for cases that an interval between the lead and the metallic film is changed.

(A) There is no necessary for setting the potential of the metallic plate 2 at a particular value, to the leads, and the eddy current effect can be obtained only by setting the metallic film 2 close to the leads. FIG. 8 shows the decrease of the self inductance caused by the eddy current. FIG. 7 shows the distribution of the eddy current on the metallic film 2 obtain by a computer simulation.

In the conventional method, there was necessity to set the potential of the metallic film 2 at a predetermined value, such as the ground potential or the power source-voltage in order to make a return current with respect to a current on the lead (the signal line) 4 flow through the metallic film 2. Since the return current flowed in the direction opposite to that of the current on the lead frame, the conventional method made use of the decrease of the effective inductance, which was derived in consideration of the mutual inductance. In other words, the conventional technology expected the decrease of the effective inductance caused by the return current, but the present invention expects the decrease of the self inductance caused by the eddy current. Accordingly, in the present invention, the potential of the metallic film 2 can be selected at will, and there is no necessity for setting its potential at a particular value.

Figure 9:
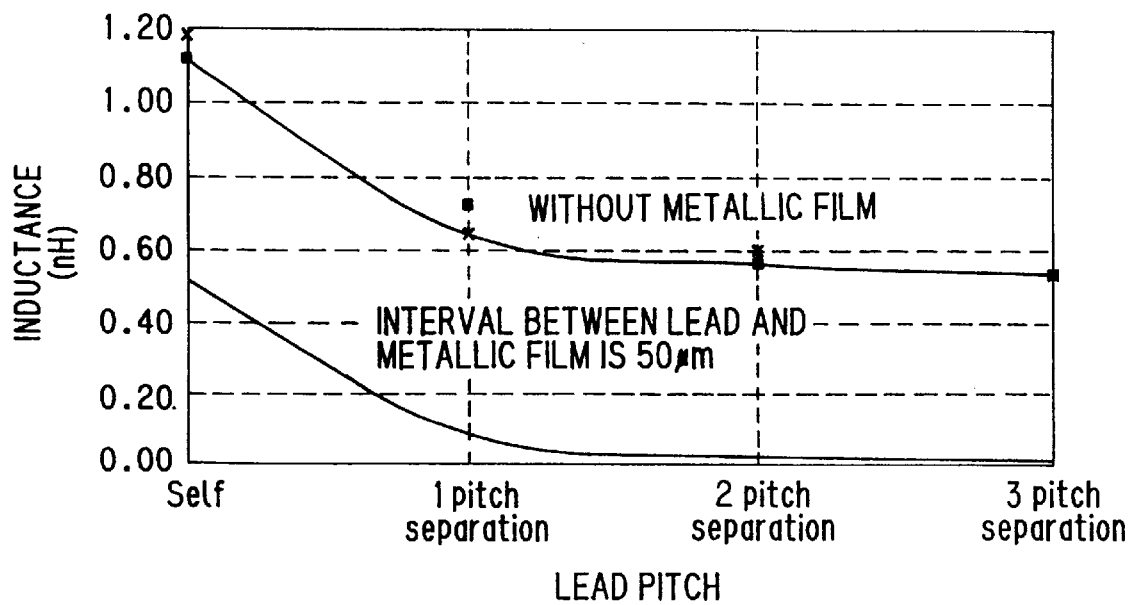
FIG. 9 shows the inductance of the lead measured at 100 MHz for cases that the metallic film exists and does not exist.

(B) The decrease of the inductance becomes noticeable as the metallic film 2 approach the lead 4 (FIG. 9). FIG. 9 shows the inductance measured at 100 MHz for both cases that the metallic film 2 exists and does not exist.

(C) The self inductance decreases as the frequency increases (FIG. 8).

Figure 10:
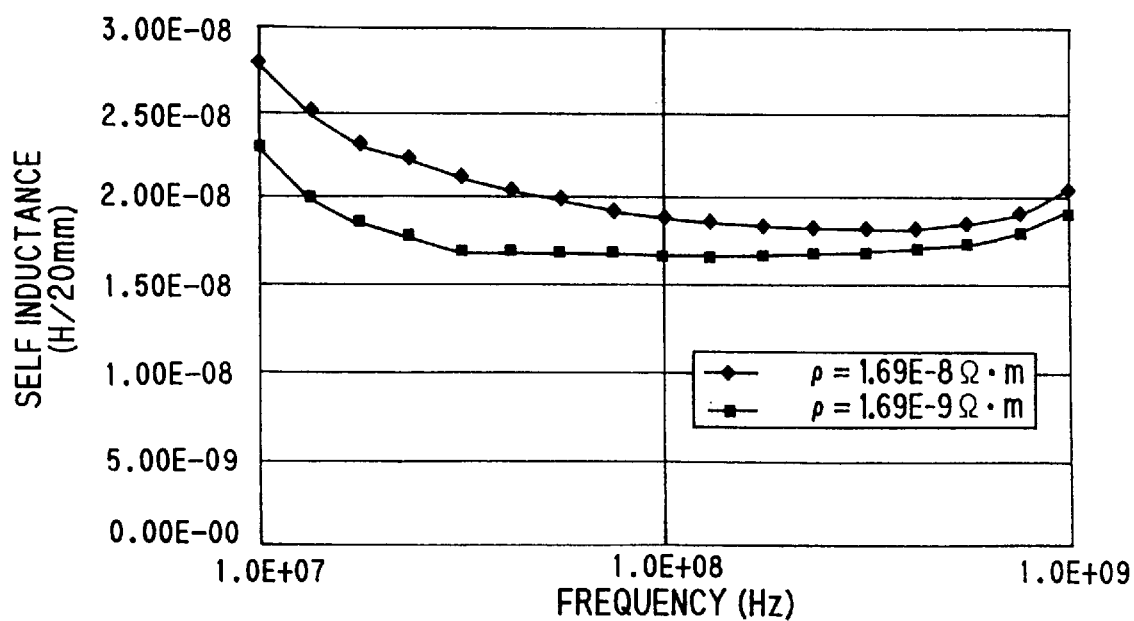
FIG. 10 shows the inductance of the lead as a function of the frequency, when a conductivity of the metallic film is changed.

(D) The self inductance decreases as the conductivity of the metallic film 2 increases (FIG. 10) FIG. 10 shows the frequency characteristic of the self inductance, where the conductivity of the metallic film 2 is shown as a parameter.

The eddy current is reduces the magnetic flux density shown as the arrow in FIG. 6, which reduces the inductance. By the same reason, a inductive noise of a magnetic flux density having the component of the direction of the arrow is reduced also.

In order to produce satisfactory results, basic data of design are limited as follows.

(a) Material of the metallic film 2 is metal with high conductivity, such as Cu, Al, Au, Ag or Cr, or alloy, main component of which is above mentioned metal. Specific resistance of metal should be lower than 30 $\mu\Omega$m.

(b) The distance between the lead and the metallic film 2 is less than 150 $\mu$m. In order to chieve magnetic flux-reducing effect, there should be some limitation on the aforementioned distance, but the maximum distance is set to be less 150 $\mu$m in consideration of a thickness of a dielectric layer of a TAB tape carrier to be used therefor.

(c) The supposed frequency corresponds to that used in a high bit rate transmission line for the digital circuit. It is necessary to transmit a digital signal with a clock signal suited for the internal circuits of a MPU on a printed circuit board for connecting an ASIC (an Application Specific Internal Circuit) with a DRAM semiconductor chip, a printed circuit board for connecting a MPU with a semiconductor chip set and a data bus for connecting external terminals of a semiconductor chip in a package with lead terminals.

Tables 2 and 3 show the lengths of the leads for signal and power-source lines and their self inductances derived by approximate calculation for both cases that the metallic film does not exist and exists. Tables 4 and 5 show the lengths of the leads shown in both columns and corresponding delay times of transmission signals. The unit of the self inductance in tables 2 and 3 is nH/mm, and the unit of the signal delay time in tables 4 and 5 is p sec ($10^{12}$ sec.).

As shown in tables 2 and 3, the length of the lead is 1 to 2 mm and the corresponding self inductance is 1 to 2 nH/mm in case the metallic film does not exist, but this value is reduced by halt in case that the metallic film exists. As shown in tables 4and 5, deviation of delay times of the leads concerned with the package is 1 to 20 p sec, and since the delay time of the control lead is controlled by a solder ball connected therewith, it be comes clear that the deviation of the delay time is kept within 3 p sec. (See the first or second column of the deviation from the minimum delay time).

TABLE 2

LEAD LENGTH AND CORRESPONDING SELF INDUCTANCE (CALCULATED)

| NO | LEAD LENGTH (mm) | | DEVIATION FROM AVERAGE LEAD LENGTH (mm) | | SELF INDUCTANCE IN CASE THAT METALLIC FILM DOES NOT EXISTS (nH) | | SELF INDUCTANCE IN CASE THAT METALLIC FILM EXISTS (nH) | |
|---|---|---|---|---|---|---|---|---|
| | SIGNAL/ CONTROL LINE | POWER-SOURCE/ GND LINE | SIGNAL/ CONTROL LINE | POWER-SOURCE/ GND LINE | SIGNAL/ CONTROL LINE | POWER-SOURCE/ GND LINE | SIGNAL/ CONTROL LINE | POWER-SOURCE/ GND LINE |
| 1 | | 2.1465 | | 0.02316 | | 2.15 | | 1.07 |
| 2 | 1.3112 | | 0.03660 | | 1.31 | | 0.66 | |
| 3 | | 2.1448 | | 0.02146 | | 2.14 | | 1.07 |

TABLE 2-continued

LEAD LENGTH AND CORRESPONDING SELF INDUCTANCE (CALCULATED)

| NO | LEAD LENGTH (mm) SIGNAL/ CONTROL LINE | LEAD LENGTH (mm) POWER-SOURCE/ GND LINE | DEVIATION FROM AVERAGE LEAD LENGTH (mm) SIGNAL/ CONTROL LINE | DEVIATION FROM AVERAGE LEAD LENGTH (mm) POWER-SOURCE/ GND LINE | SELF INDUCTANCE IN CASE THAT METALLIC FILM DOES NOT EXISTS (nH) SIGNAL/ CONTROL LINE | SELF INDUCTANCE IN CASE THAT METALLIC FILM DOES NOT EXISTS (nH) POWER-SOURCE/ GND LINE | SELF INDUCTANCE IN CASE THAT METALLIC FILM EXISTS (nH) SIGNAL/ CONTROL LINE | SELF INDUCTANCE IN CASE THAT METALLIC FILM EXISTS (nH) POWER-SOURCE/ GND LINE |
|---|---|---|---|---|---|---|---|---|
| 4 | 1.2902 | | 0.01560 | | 1.29 | | 0.65 | |
| 5 | | 2.1246 | | 0.00126 | | 2.12 | | 1.06 |
| 6 | 1.3087 | | 0.03410 | | 1.31 | | 0.55 | |
| 7 | | 2.1092 | | -0.01414 | | 2.11 | | 1.05 |
| 8 | 1.2930 | | 0.01840 | | 1.29 | | 0.65 | |
| 9 | | 2.0417 | | -0.08164 | | 2.04 | | 1.02 |
| 10 | 1.2258 | | -0.04880 | | 1.23 | | 0.61 | |
| 11 | | 2.0264 | | -0.09694 | | 2.03 | | 1.01 |
| 12 | 1.2105 | | -0.06410 | | 1.21 | | 0.61 | |
| 13 | | 2.0500 | | -0.07334 | | 2.05 | | 1.03 |
| 14 | 1.1948 | | -0.07980 | | 1.19 | | 0.60 | |
| 15 | | 2.0338 | | -0.08954 | | 2.03 | | 1.02 |
| 16 | 1.2085 | | -0.06610 | | 1.21 | | 0.60 | |
| 17 | | 1.9957 | | -0.12764 | | 2.00 | | 1.00 |
| 18 | 1.0850 | | -0.18960 | | 1.09 | | 0.54 | |
| 19 | | 2.3283 | | 0.20496 | | 2.33 | | 1.16 |
| 20 | 1.2619 | | -0.01270 | | 1.26 | | 0.63 | |
| 21 | | 2.0947 | | -0.02864 | | 2.09 | | 1.05 |
| 22 Center | 1.1509 | | -0.12370 | | 1.15 | | 0.58 | |
| 23 | 1.1807 | | -0.09390 | | 1.18 | | 0.59 | |
| 24 | | 2.0077 | | -0.11564 | | 2.01 | | 1.00 |
| 25 | 1.2234 | | 0.05120 | | 1.22 | 0.61 | | |

TABLE 3

LEAD LENGTH AND CORRESPONDING SELF INDUCTANCE (CALCULATED)

| NO | LEAD LENGTH (mm) SIGNAL/ CONTROL LINE | LEAD LENGTH (mm) POWER-SOURCE/ GND LINE | DEVIATION FROM AVERAGE LEAD LENGTH (mm) SIGNAL/ CONTROL LINE | DEVIATION FROM AVERAGE LEAD LENGTH (mm) POWER-SOURCE/ GND LINE | SELF INDUCTANCE IN CASE THAT METALLIC FILM DOES NOT EXISTS (nH) SIGNAL/ CONTROL LINE | SELF INDUCTANCE IN CASE THAT METALLIC FILM DOES NOT EXISTS (nH) POWER-SOURCE/ GND LINE | SELF INDUCTANCE IN CASE THAT METALLIC FILM EXISTS (nH) SIGNAL/ CONTROL LINE | SELF INDUCTANCE IN CASE THAT METALLIC FILM EXISTS (nH) POWER-SOURCE/ GND LINE |
|---|---|---|---|---|---|---|---|---|
| 26 | | 2.0558 | | -0.06754 | | 2.06 | | 1.03 |
| 27 | 1.2267 | | -0.04790 | | 1.23 | | 0.61 | |
| 28 | | 2.1067 | | -0.01664 | | 2.11 | | 1.05 |
| 29 | 1.2722 | | -0.00240 | | 1.27 | | 0.64 | |
| 30 | | 2.0985 | | -0.02464 | | 2.10 | | 1.05 |
| 31 | 1.2950 | | 0.02040 | | 1.30 | | 0.65 | |
| 32 | | 2.1113 | | -0.01204 | | 2.11 | | 1.06 |
| 33 | 1.2822 | | 0.00760 | | 1.28 | | 0.64 | |
| 34 | | 2.1337 | | 0.01036 | | 2.13 | | 1.07 |
| 35 | 1.2946 | | 0.02000 | | 1.29 | | 0.65 | |
| 36 | | 2.1109 | | -0.01244 | | 2.11 | | 1.06 |
| 37 | 1.3103 | | 0.03570 | | 1.31 | | 0.66 | |
| 38 | | 2.1262 | | 0.00286 | | 2.13 | | 1.06 |
| 39 | 1.2872 | | 0.01260 | | 1.29 | | 0.64 | |
| 40 | | 2.1415 | | 0.01816 | | 2.14 | | 1.07 |
| 41 | 1.3025 | | 0.02790 | | 1.30 | | 0.65 | |
| 42 | | 2.2091 | | 0.08576 | | 2.21 | | 1.10 |
| 43 | 1.3692 | | 0.09460 | | 1.37 | | 0.68 | |
| 44 | | 2.2244 | | 0.10106 | | 2.22 | | 1.11 |
| 45 | 1.3853 | | 0.11070 | | 1.39 | | 0.69 | |
| 46 | | 2.2062 | | 0.08286 | | 2.21 | | 1.10 |
| 47 | 1.4056 | | 0.13100 | | 1.41 | | 0.70 | |
| 48 | | 2.2273 | | 0.10396 | | 2.23 | | 1.11 |
| 49 | 1.4897 | | 0.21510 | | 1.49 | | 0.74 | |
| 50 | | 2.2285 | | 0.10516 | | 2.23 | | 1.11 |
| AVERAGE | 1.2746 | 2.1233 | 0.0000 | 0.0000 | 1.27 | 2.12 | 0.64 | 1.06 |

TABLE 3-continued

LEAD LENGTH AND CORRESPONDING SELF INDUCTANCE (CALCULATED)

| NO | LEAD LENGTH (mm) | | DEVIATION FROM AVERAGE LEAD LENGTH (mm) | | SELF INDUCTANCE IN CASE THAT METALLIC FILM DOES NOT EXISTS (nH) | | SELF INDUCTANCE IN CASE THAT METALLIC FILM EXISTS (nH) | |
|---|---|---|---|---|---|---|---|---|
| | SIGNAL/ CONTROL LINE | POWER-SOURCE/ GND LINE | SIGNAL/ CONTROL LINE | POWER-SOURCE/ GND LINE | SIGNAL/ CONTROL LINE | POWER-SOURCE/ GND LINE | SIGNAL/ CONTROL LINE | POWER-SOURCE/ GND LINE |
| MIN | 1.0850 | 1.9957 | −0.18960 | −0.12764 | 1.09 | 2.00 | 0.54 | 1.00 |
| MAX | 1.4897 | 2.3283 | 0.21510 | 0.20496 | 1.49 | 2.33 | 0.74 | 1.16 |

15

TABLE 4

LEAD LENGTH AND CORRESPONDING PULSE TRANSMISSION TIME

| NO | LEAD LENGTH (mm) | | LENGTH OF LEAD FROM STANDARD POINT ON CIRCUIT BOARD (mm) | | | | TRANSMISSION TIME FROM STANDARD POINT OF CIRCUIT BOARD AS FUNCTION OF LEAD LENGTH (psec) | | | | DEVIATION FROM MINIMUM DELAY TIME (psec) | | | |
|---|---|---|---|---|---|---|---|---|---|---|---|---|---|---|
| | SIGNAL/ CONTROL LINE | POWER-SOURCE/ GND LINE | COLUMN 1 | COLUMN 2 | COLUMN 3 | COLUMN 4 | COLUMN 1 | COLUMN 2 | COLUMN 3 | COLUMN 4 | COLUMN 1 | COLUMN 2 | COLUMN 3 | COLUMN 4 |
| 1 | | 2.1465 | | | | 3.542 | | | | 38.8 | | | | 27.2 |
| 2 | 1.3112 | | | | 2.792 | | | | 28.4 | | | | 16.8 | |
| 3 | | 2.1448 | 0.000 | | | | 12.4 | | | | 0.8 | | | |
| 4 | 1.2902 | | | 0.750 | | | | 1.30 | | | | 1.4 | | |
| 5 | | 2.1246 | | | | 3.542 | | | | 38.7 | | | | 27.1 |
| 6 | 1.3087 | | | | 2.792 | | | | 28.4 | | | | 16.8 | |
| 7 | | 2.1092 | 0.000 | | | | 12.2 | | | | 0.6 | | | |
| 8 | 1.2930 | | | 0.750 | | | | 13.1 | | | | 1.5 | | |
| 9 | | 2.0417 | | | | 3.542 | | | | 38.2 | | | | 26.6 |
| 10 | 1.2258 | | | | 2.792 | | | | 27.90 | | | | 16.3 | |
| 11 | | 2.0264 | 0.000 | | | | 11.7 | | | | 0.1 | | | |
| 12 | 1.2105 | | | 0.750 | | | | 12.6 | | | | 1.0 | | |
| 13 | | 2.0500 | | | | 3.542 | | | | 38.3 | | | | 26.7 |
| 14 | 1.1948 | | | | 2.792 | | | | 27.7 | | | | 16.1 | |
| 15 | | 2.0338 | 0.000 | | | | 11.8 | | | | 0.2 | | | |
| 16 | 1.2085 | | | 0.750 | | | | 12.6 | | | | 1.0 | | |
| 17 | | 1.9957 | | | | 3.542 | | | | 38.0 | | | | 26.4 |
| 18 | 1.0850 | | | | 2.792 | | | | 27.1 | | | | 15.5 | |
| 19 | | 2.3283 | 0.000 | | | | 13.5 | | | | 1.9 | | | |
| 20 | 1.2619 | | | 0.750 | | | | 12.9 | | | | 1.3 | | |
| 21 | | 2.0947 | | | | 3.542 | | | | 38.5 | | | | 26.9 |
| 22 Center | 1.1509 | | | | 2.792 | | | | 27.5 | | | | 15.9 | |
| 23 | 1.1807 | | | 0.750 | | | | 12.4 | | | | 0.8 | | |
| 24 | | 2.0077 | 0.000 | | | | 11.6 | | | | 0.0 | | | |
| 25 | 1.2234 | | | | 2.792 | | | | 27.9 | | | | 15.5 | |

TABLE 5

LEAD LENGTH AND CORRESPONDING PULSE TRANSMISSION TIME

| NO | LEAD LENGTH (mm) | | LENGTH OF LEAD FROM STANDARD POINT ON CIRCUIT BOARD (mm) | | | | TRANSMISSION TIME FROM STANDARD POINT OF CIRCUIT BOARD AS FUNCTION OF LEAD LENGTH (psec) | | | | DEVIATION FROM MINIMUM DELAY TIME (psec) | | | |
|---|---|---|---|---|---|---|---|---|---|---|---|---|---|---|
| | SIGNAL/ CONTROL LINE | POWER-SOURCE/ GND LINE | COLUMN 1 | COLUMN 2 | COLUMN 3 | COLUMN 4 | COLUMN 1 | COLUMN 2 | COLUMN 3 | COLUMN 4 | COLUMN 1 | COLUMN 2 | COLUMN 3 | COLUMN 4 |
| 26 | | 2.0558 | | | | 3.542 | | | | 38.3 | | | | 26.7 |
| 27 | 1.2267 | | | 0.750 | | | | 12.7 | | | | 1.1 | | |
| 28 | | 2.1067 | 0.000 | | | | 12.2 | | | | 0.6 | | | |

TABLE 5-continued

LEAD LENGTH AND CORRESPONDING PULSE TRANSMISSION TIME

| NO | LEAD LENGTH (mm) | | LENGTH OF LEAD FROM STANDARD POINT ON CIRCUIT BOARD (mm) | | | | TRANSMISSION TIME FROM STANDARD POINT OF CIRCUIT BOARD AS FUNCTION OF LEAD LENGTH (psec) | | | | DEVIATION FROM MINIMUM DELAY TIME (psec) | | | |
|---|---|---|---|---|---|---|---|---|---|---|---|---|---|---|
| | SIGNAL/ CONTROL LINE | POWER-SOURCE/ GND LINE | COL-UMN 1 | COL-UMN 2 | COL-UMN 3 | COL-UMN 4 | COL-UMN 1 | COL-UMN 2 | COL-UMN 3 | COL-UMN 4 | COL-UMN 1 | COL-UMN 2 | COL-UMN 3 | COL-UMN 4 |
| 29 | 1.2722 | | | | 2.792 | | | | 28.2 | | | | 15.8 | |
| 30 | | 2.0985 | | | | 3.542 | | | | 38.5 | | | | 26.9 |
| 31 | 1.2950 | | | 0.750 | | | | 13.1 | | | | 1.5 | | |
| 32 | | 2.1113 | 0.000 | | | | 12.2 | | | | 0.6 | | | |
| 33 | 1.2822 | | | | 2.792 | | | | 28.2 | | | | 15.8 | |
| 34 | | 2.1337 | | | | 3.542 | | | | 38.7 | | | | 27.1 |
| 35 | 1.2946 | | | 0.750 | | | | 13.1 | | | | 1.5 | | |
| 36 | | 2.1109 | 0.000 | | | | 12.2 | | | | 0.5 | | | |
| 37 | 1.3103 | | | | 2.792 | | | | 28.4 | | | | 16.0 | |
| 38 | | 2.1262 | | | | 3.542 | | | | 38.7 | | | | 27.1 |
| 39 | 1.2872 | | | 0.750 | | | | 13.0 | | | | 1.4 | | |
| 40 | | 2.1415 | 0.000 | | | | 12.4 | | | | 0.8 | | | |
| 41 | 1.3025 | | | | 2.792 | | | | 28.4 | | | | 15.9 | |
| 42 | | 2.2091 | | | | 3.542 | | | | 39.2 | | | | 27.6 |
| 43 | 1.3692 | | | 0.750 | | | | 13.5 | | | | 1.9 | | |
| 44 | | 2.2244 | 0.000 | | | | 12.9 | | | | 1.3 | | | |
| 45 | 1.3853 | | | | 2.792 | | | | 28.8 | | | | 16.4 | |
| 46 | | 2.2062 | | | | 3.542 | | | | 39.2 | | | | 27.6 |
| 47 | 1.4056 | | | 0.750 | | | | 13.7 | | | | 2.1 | | |
| 48 | | 2.2273 | 0.000 | | | | 12.9 | | | | 1.3 | | | |
| 49 | 1.4897 | | | | 2.792 | | | | 29.4 | | | | 17.0 | |
| 50 | | 2.2285 | | | | 3.542 | | | | 39.3 | | | | 27.7 |
| AVERAGE | 1.2746 | 2.1233 | | | | | 12.3 | 13.0 | 28.2 | 38.6 | 0.7 | 1.4 | 16.1 | 27.0 |
| MIN | 1.0850 | 1.9957 | | | | | 11.6 | 12.4 | 27.1 | 38.0 | 0.0 | 0.8 | 15.5 | 26.4 |
| MAX | 1.4897 | 2.3283 | | | | | 13.5 | 13.7 | 29.4 | 39.3 | 1.9 | 2.1 | 17.0 | 27.7 |

Recently, the data transmission with the clock signal of 100 MHz to 1 GHz is regarded as important. In a sinusoidal signal, the frequency of 10 MHz to 15 GHz must be taken into consideration. Since, in the frequency region lower than 10 MHz, the magnetic flux-reducing effect by the eddy current Is is not so noticeable, the aforementioned lower frequency is beyond the scope of the present investigation.

There is a later mentioned relation between the clock and sinusoidal signals, and a rise-up portion or a fall-down portion of the clock signal closely relates to noise generation. The wave form of this portion is analised into sinusoidal signal components by Fourier expansion, and a sinusoidal component with the maximum amplitude is regarded as the fundamental component. The aforementioned frequency range is set up by taking the tenth harmonic thereof into consideration at the maximum.

Figure 11:
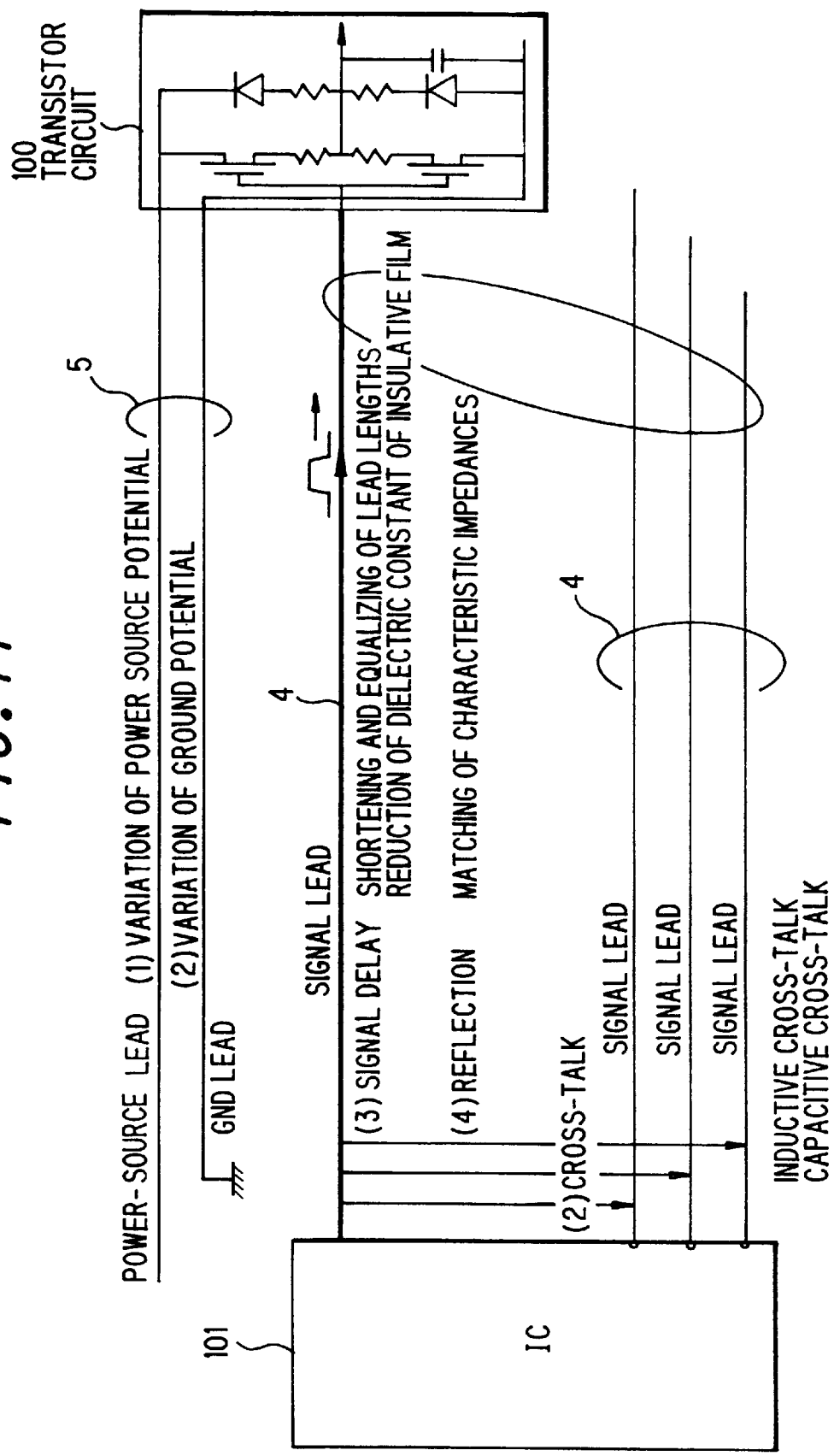
FIG. 11 is a circuit diagram for explaining a cause of noise generated in a high frequency region.

Next, causes of the noise in the high frequency region will be explained referring to FIG. 11. Four kinds of causes of noise mentioned later can be enumerated. In FIG. 11, 100 is an example of a transistor circuit in the semiconductor chip.

1) Variation of a Power Source Potential and Variation of a Ground Potential.

Figure 12:
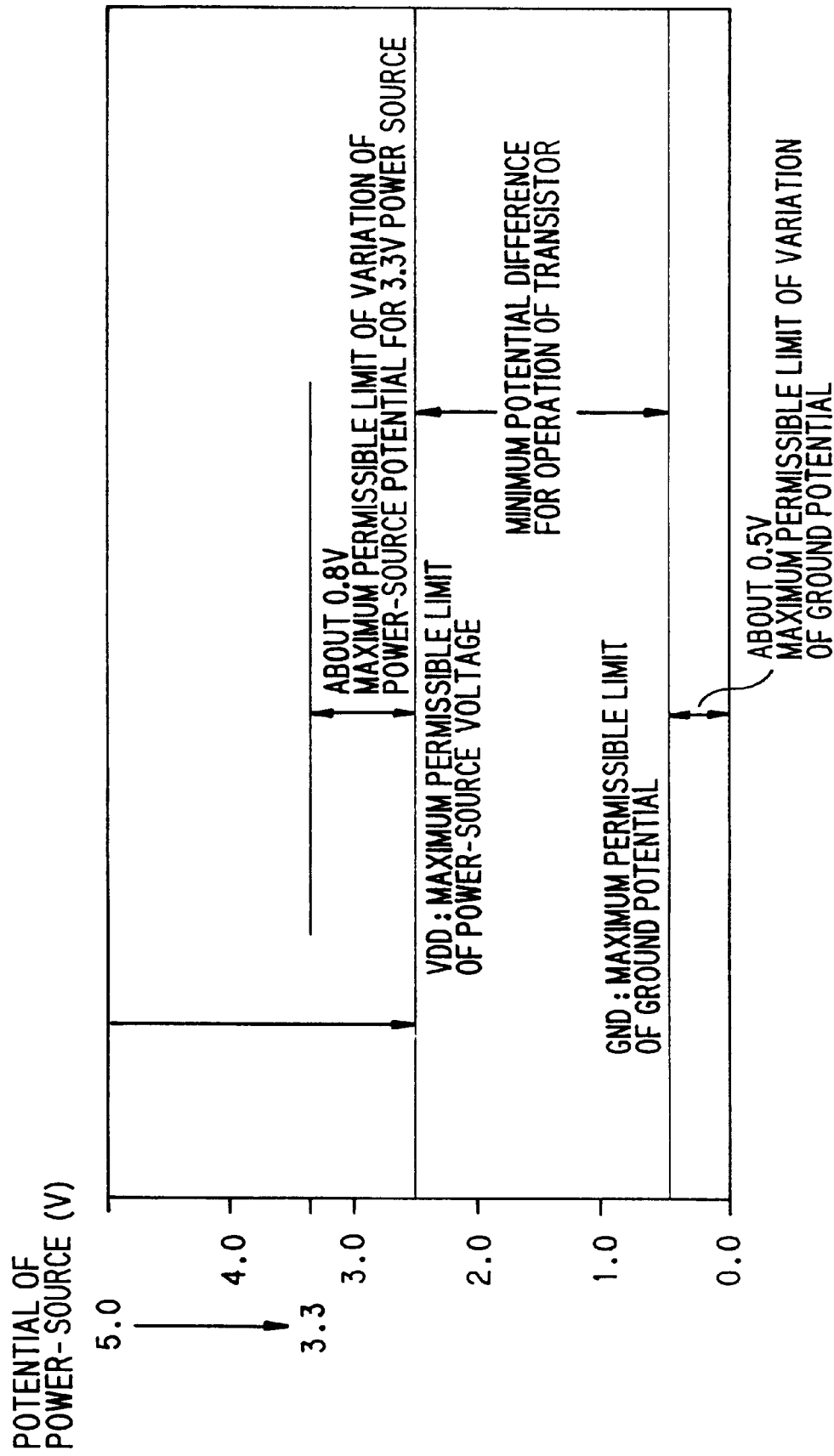
FIG. 12 shows permissible limits of variations of the power source and ground potentials of a transistor in case the power source voltage is changed from 5V to 3.3V.

Variation of a ground potential has been called ground bouncing, and investigated separated from that of a power source. It results from the fact that allowance of the variation of the ground potential has been more strict than that of the power source, but these phenomena are caused by the same reason (FIG. 12). FIG. 12 shows the variations of the margins of the power source and ground potentials for an operation of a transistor, when the power source voltage is changed from 5 V to 3 V.

Figure 13:
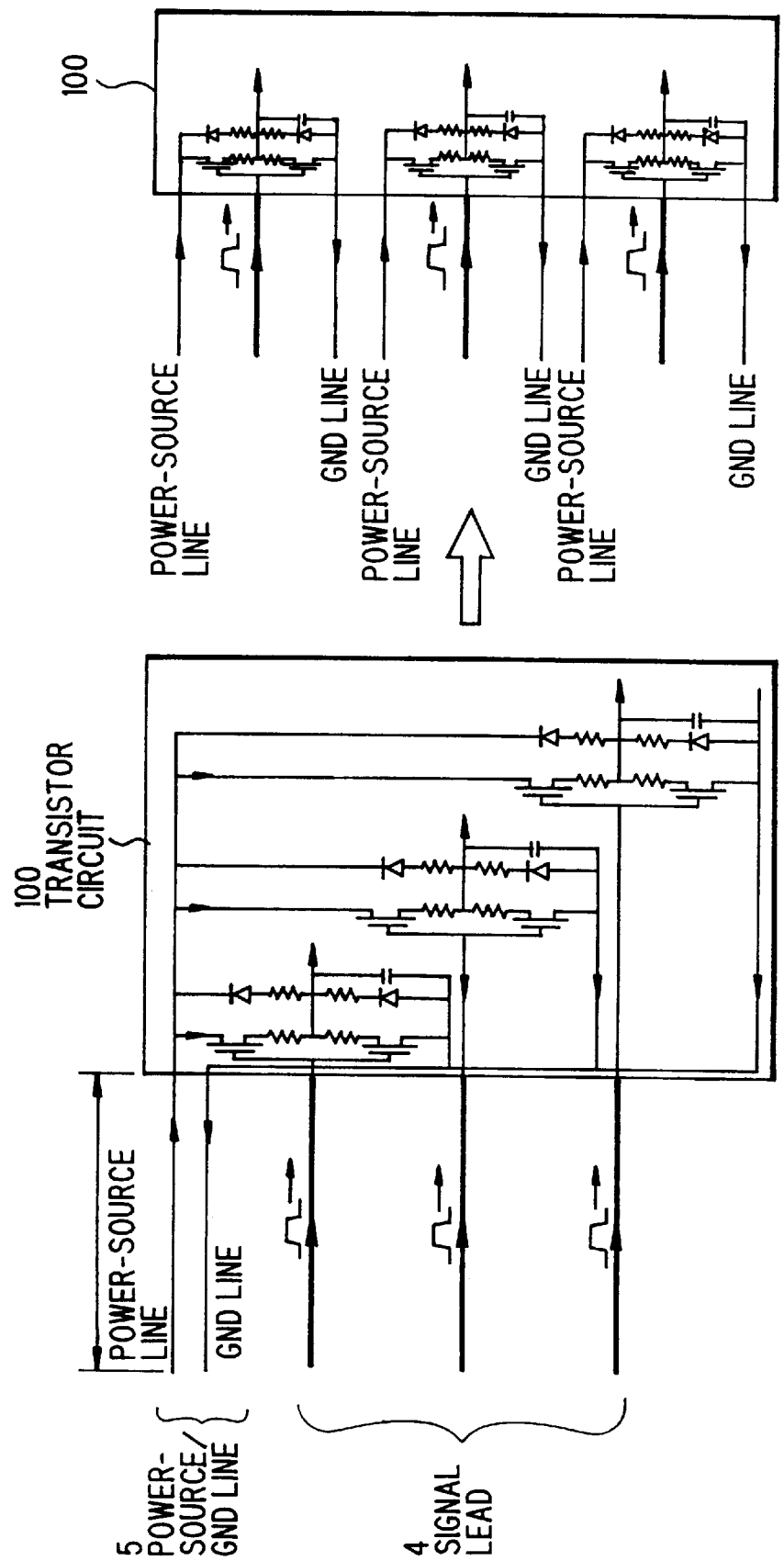
FIG. 13 shows an example of a transistor circuit on a semiconductor chip.

In a circuit shown in FIG. 13, when currents on several lines flow into the same power source and the same circuit, potentials of terminals of the semiconductor chip 1 are not the inherent power source and ground potentials, but potentials determined by the inductances of the lines and the current flowing therethrough. On this problems, following countermeasures can be considered.

(1) Multiple power source and grounding circuits are provided in order to distribute the currents flowing therethrough and avoid the situation that the currents concentrates in a particular circuit. By the reason mentioned in the above, in the first preferred embodiment, one or two signal lines are provided with a ground line and a power source line.

(2) The inductances of the power source and ground lines should be reduces. It is one method for reducing these inductances to shorten the lengths of these lines. Moreover, another method is that a metallic film (an electromagnetic shielding film) 2 is set close to these leads, and the effect of the eddy current is utilizedaas shown in the first preferred embodiment.

2) Cross-talk Noise (a phenomenon similar to cross-talk in a telephone line).

There are two kinds of cross-talk noise, one is inductive noise and the other is passive noise.

Noise of two kinds are simultaneously generated in some cases, and it is difficult to separated them from each other.

(1) Inductive Cross-talk Noise.

Figure 14:
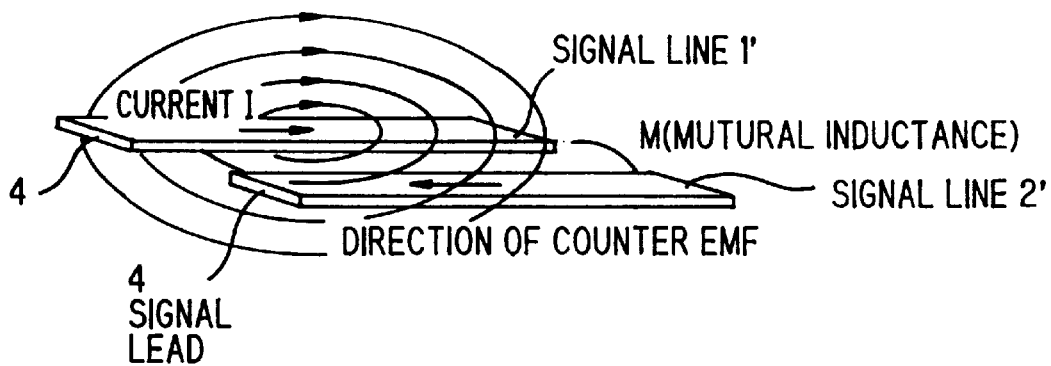
FIG. 14 is a perspective view for showing two parallel signal lines, on which a counter e.m.f is induced on a signal line 2' by a current on a signal line 1'.

A magnetic flux generated by a current flowing through a line interlinks with an adjacent line, and a counter e.m.f. V is generated therealong. In this phenomenon, a mutual inductance M therebetween plays a dominant role. Since the eddy current Is generated in the metallic film 2 set closed the leads reduces the magnetic flux generated by an inducing line, the mutual inductance M is noticeably reduced. In the first preferred embodiment, when the metallic film 2 is set close to the leads, the measured mutual inductance M is in the order of 0.1 as compared with that in the ordinary case. The eddy current Is generated in the metallic film 2 not only suppress intrusion of external noise, but also suppress leakage of internal noise generated in an inner circuit (FIG. 14). As shown in FIG. 14, in case that a current 1 flows in a signal line 1' (corresponding to a signal lead 4 in FIG. 1) a counter e.m.f. V=jwMI arises in a signal line 2' (corresponding to a signal lead 4 in FIG. 1).

(2) Capacitive Cross Talk Noise

Figure 15:
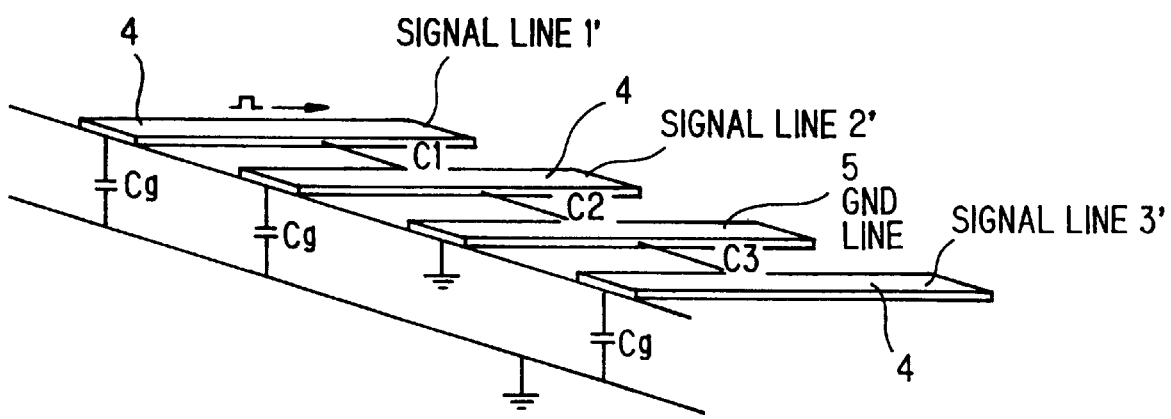
FIG. 15 is a perspective view for explaining capacitive cross-talk noise.

Because of partial capacitance $C_1$, $C_2$ and $C_3$ between lines, a noise voltage arises on the adjacent line by capacitive voltage dividing. Noise voltage is determined by a capacitive voltage dividing ratio, which is derived from the ground capacitance $C_g$ and the partial capacitances $C_1$, $C_2$ and $C_3$ between the lines. If the partial capacitances $C_1$, $C_2$ and $C_3$ are very small as compared with the ground capacitance $C_g$, the capacitive cross talk does not become a serious problem (FIG. 15). As shown in FIG. 15, in case that a pulse current flow on the signal line 1', a capacitively divided voltage given by equation (2) arises on the signal line 2'.

$$V_{2P}=(C_g+C_2)(C_1+C_2+C_g)/(C_1\times(C_2+C_g))\times V_{IP} \quad (2)$$

In case that $C_1 \ll C_g$, $v_{2P}$ the capacitive cross talk noise does not become a serious problem.

As mentioned in the above since the eddy current Is, which flows in such a direction that the flux generated by the current I on the lead 4 is reduced, arises on the metallic film 2 set close to the lead 4, the inductances of the lines (the self inductance of the lines and the mutual inductance between the lines) and the inductive cross talk therebetween can be reduced. Accordingly, transmission speed of signals and data can be increased.

3) Reflection Noise

Reflection noise is caused by reflection of a signal occurring at a point where a characteristic impedance of the line is changed. Since the reflected wave returns to a sending end, the signal is distorted similarly to the case that noise is superposed thereon. Moreover, since the reflected signal component does not reach a receiving end, the transmitted signal is distorted also. In case that the frequency is high and the line must be treated as a distributed element line, reflection noise become a problem. In the frequency range 10 MHz to 15 GHz, which is regarded as important in the invention, this phenomenon become a problem in case that the line length becomes several mm. In a semiconductor chip 1 with a extremely short wiring length, there is no necessity taking reflection noise into consideration.

Reflection noise become an issue in a transmission line on the printed circuit board. The structure of the printed circuit board is designed so that the characteristic impedance of a line is kept to be constant. It is difficult to devise a countermeasure in a wiring in a package, and the length of this wiring is several mm. The phenomenon can be qualitatively understood by a lumped element circuit consideration to some extent, but in order to analyse the problem quantitatively, an analysis based on a distributed element line is necessary.

It is very important to understand the propagation velocity and the transmission time of the signal. In the embodiment 1. since insulative material of the line is polyimide, dielectric constant of polyimide determines the propagation velocity of the signal. Table 6 shows the propagation velocity and the transmission distance of the signal. Data are computed assuming that the light velocity is (2,998 E+11) mm/sec.

If the signals, which start at the same time and transmit through the different line, reach the input terminals of the semiconductor chip at different times, timings of operation of the transistors in the semiconductor chip are different from each other, which becomes cause of miss operation, hence this phenomenon is treated a kind of noise. It is necessary that this phenomenon is strictly controlled as the frequency increases. Particular attention should be payed on the signal lines and the controlling circuits.

TABLE 6

TRANSMISSION DISTANCE AND DELAY TIME (CALCULATED)

| DIELECTRIC CONSTANT OF INSULATIVE FILM | TRANSMISSION VELOCITY | TRANSMISSION DISTANCE | | | DELAY TIME |
|---|---|---|---|---|---|
| | | 2.5 nsec | 0.1 nsec | 10 psec | 1 mm LENGTH |
| 3.0 | 1.731E + 11 mm/sec | 433 mm | 17 mm | 1.73 mm | 0.0058 nsec |
| 3.5 | 1.602E + 11 mm/sec | 401 mm | 16 mm | 1.60 mm | 0.0062 nsec |
| 4.0 | 1.499E + 11 mm/sec | 375 mm | 15 mm | 1.50 mm | 0.0067 nsec |
| 5.0 | 1.341E + 11 mm/sec | 335 mm | 14 mm | 1.34 mm | 0.0075 nsec |
| 5.5 | 1.278E + 11 mm/sec | 320 mm | 13 mm | 1.28 mm | 0.0078 nsec |
| 6.0 | 1.224E + 11 mm/sec | 306 mm | 12 mm | 1.22 mm | 0.0082 nsec |
| 6.5 | 1.176E + 11 mm/sec | 294 mm | 12 mm | 1.18 mm | 0.0085 nsec |
| 7.0 | 1.133E + 11 mm/sec | 283 mm | 11 mm | 1.13 mm | 0.0088 nsec |

(LIGHT VELOCITY IS ASSUMED TO BE 2.998 E + 11 mm/sec)

(The second preferred invention)

Figure 16:
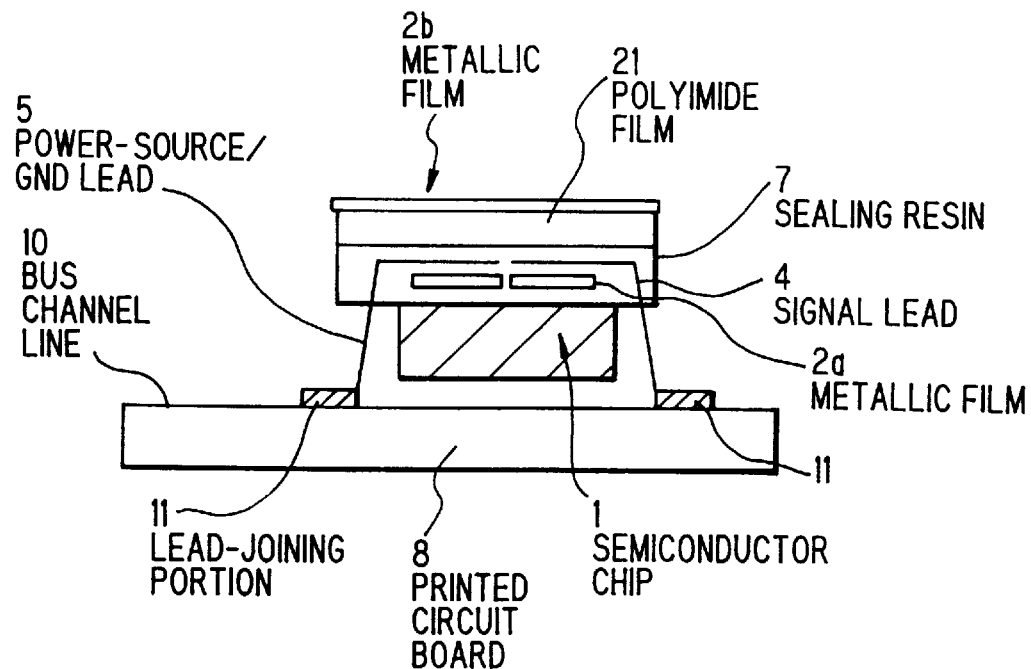
FIG. 16 is a cross-sectional view for showing an outline of a structure of a DRAM of LOC structure according to the second preferred embodiment of the invention.

FIG. 16 approximately shows the structure of a DRAM memory of LOC structure according to the second preferred embodiment of the invention.

As shown in FIG. 16, the DRAM of LOC structure according to the second preferred embodiment of the invention is an improvement of that according to the first preferred embodiment, in which a metallic film (an electromagnetic shielding film) 2b is further provided directly overhead the aforementioned leads 4 and 5 via a polyimide layer 21. In other words, the leads 4 and 5 are sandwiched between the metallic films 2a and 2b, and an effect of the electromagnetic wave can be further reduced. In FIG. 16, bonding wires are omitted.

(The third preferred embodiment)

Figure 17:
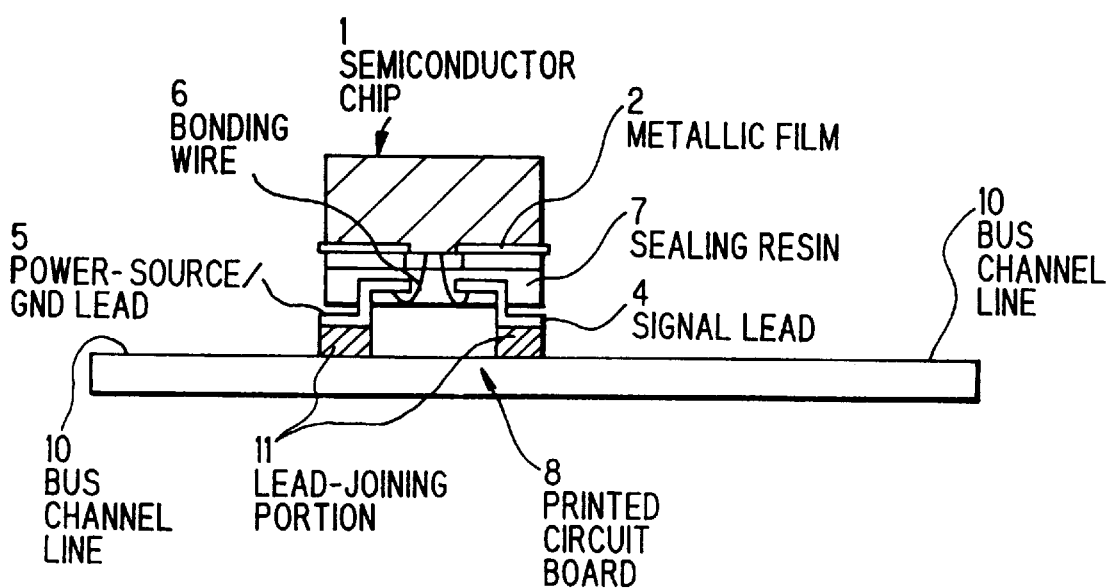
FIG. 17 is a cross-sectional view for showing an outline of a structure of DRAM of LOC structure according to the third preferred embodiment of the invention.

FIG. 17 is a cross-sectional view for showing an outline of a structure of a DRAM memory of LOC structure according to the third preferred embodiment of the invention.

As shown in FIG. 17, a DRAM of LOC structure according to the third preferred embodiment is an improvement of that according to the first preferred embodiment from the aspect of a device for suppressing electromagnetic wave. A sum lengths of leads 4 and 5 are nearly the same as that of a semiconductor chip 1 and the effect of electromagnetic wave is reduced by the semiconductor chip 1 and a metallic film 2 (a electromagnetic shielding layer). The structure shown in FIG. 17 is inferior to that shown in FIG. 16 from the aspect of shielding from electromagnetic wave, but suited for small-sizing the LOC structure.

(The fourth preferred embodiment)

Figure 18:
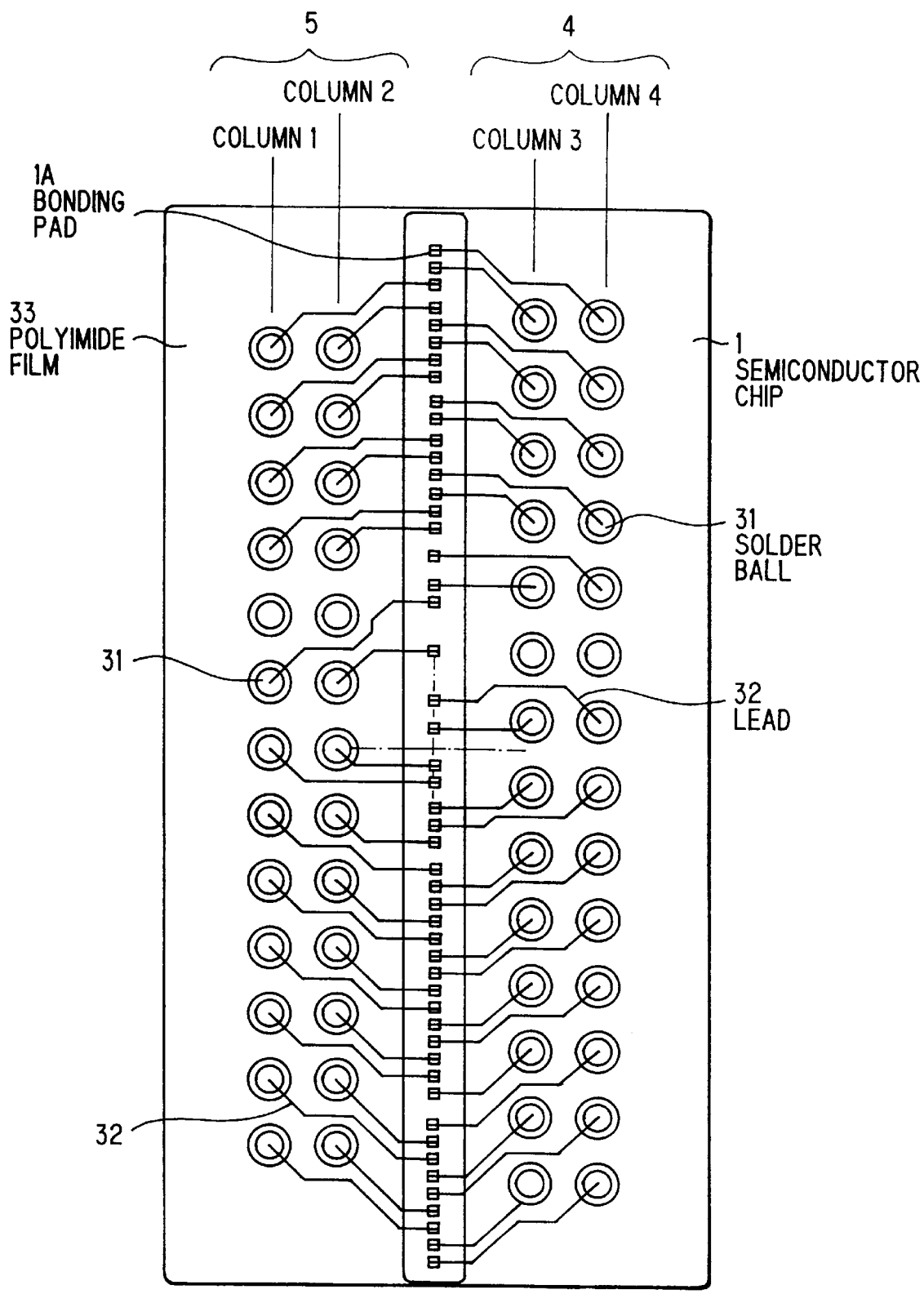
FIG. 18 is a planar view for showing an outline of a structure of a CSP type-DRAM of LOC and BGA structure according to the fourth preferred embodiment of the invention.

FIG. 18 is a planar view of a CSP type-DRAM of BGA and LOC structure according to the fourth preferred embodiment of the invention.

Figure 19:
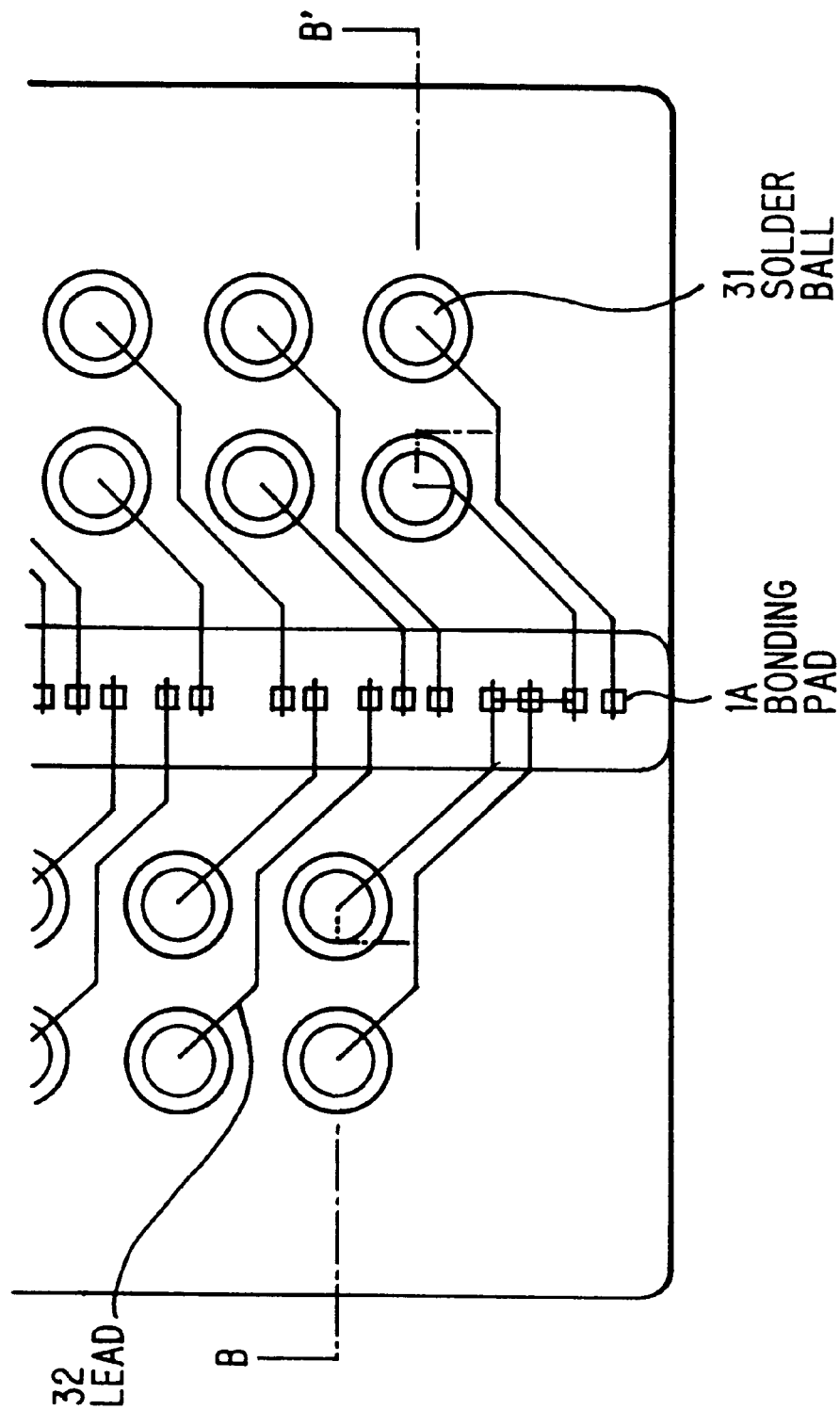
FIG. 19 is an enlarged diagram for showing an important part of FIG. 18.
Figure 20:
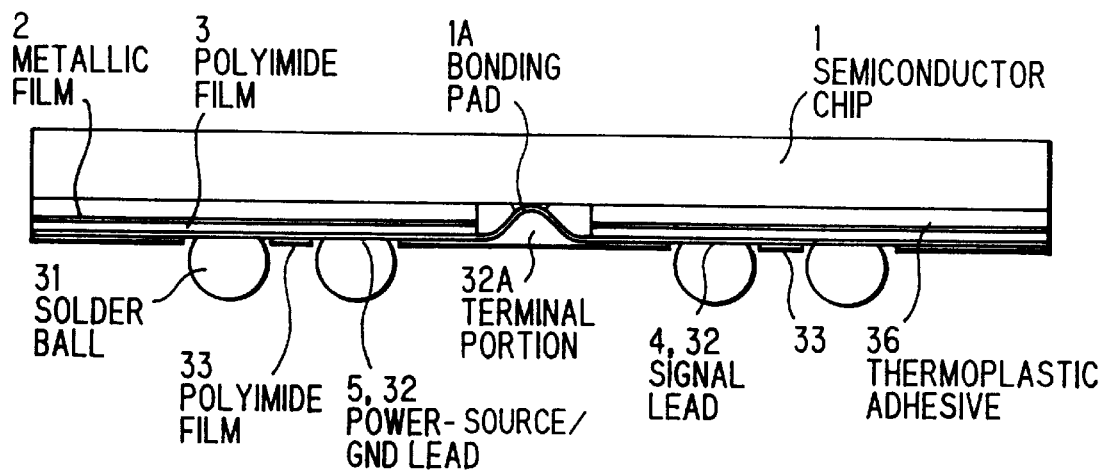
FIG. 20 is a cross-sectional view of FIG. 19 in B–B' cross-section.
Figure 21:
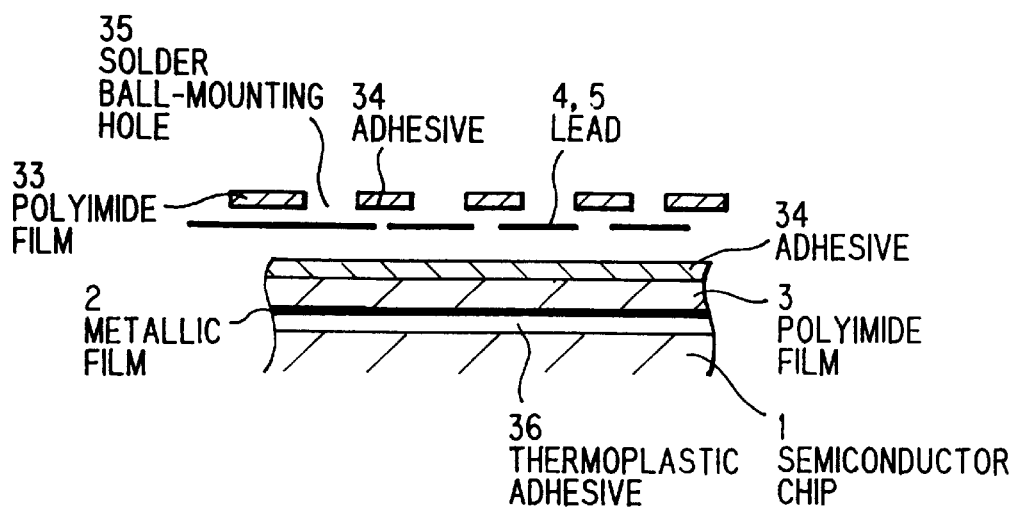
FIG. 21 is a disassembled cross-sectional view for showing an electromagnetic shielding device shown in FIG. 20, FIGS. 22A and 22B show an example of computer simulation for analysing noise on signal leads in a package of a CSP type DRAM of BGA structure according to the fourth preferred embodiment of the invention.

FIG. 19 is a enlarged diagram for shown an important part of FIG. 18. FIG. 20 is a cross-sectional view of FIG. 19 in B–B' cross-section, and FIG. 21 is a disassembled cross-sectional view for showing a electromagnetic wave-suppressing device shown in FIG. 20. In FIGS. 18 to 21, 31 is a solder ball, 32 is a lead in a CSP type-DRAM package of a BGA structure (a Cu film), 33 is a polyimide film (an insulative film) on which solder ball-mounting holes are formed, 34 is adhesive formed of resin of epoxy series, 35 is a solder ball-mounting hole, and 36 is thermoplastic adhesive formed of thermoplastic polymer or B stage epoxy resin.

As shown in FIGS. 18 to 21, a CSP type-DRAM of BGA structure is formed into a micro BGA package used in a high speed memory, and external terminals of the semiconductor chip are formed on one surface of the semiconductor chip. The bonding pads 1A of the semiconductor chip are positioned at the central portion of the main surface thereof. As shown in FIGS. 20 and 21, the main surface of the semiconductor chip 1 is covered With a metallic film (an electromagnetic shielding film) 2 via thermoplastic adhesive 36 except the region of the bonding pads 1, and the metallic film 2 is covered with an insulative film (polyimide film) 3. The leads 32 for a signal and a power source/GND are formed on the insulative film 3 via adhesive 34 formed of epoxy resin, and the terminal portion of the lead 32 is electrically connected with the bonding pads 1A on the main surface of the semiconductor chip 1.

A polyimide film (an insulative film) 33, on which holes for mounting solder balls are made, is stuck to the aforementioned leads 32 by means of adhesive 34, and the solder ball 31 is set on a solder ball-mounting hole 35. The solder balls 31, which are electrically connected with the signal lead 32, are positioned at the left side, and the power source/GND solder balls 31 connected with the power source/GND leads 32 on the right side, the positions of the signal solder balls and those of the power source/GND balls are shifted from each other in the longitudinal direction by a half pitch.

As mentioned in the above, in the arrangement of the solder balls 31 shown FIG. 18, the leads 32 starting from the bonding pad of the semiconductor device can be easily provided and the length of the wiring in the package can be shortened similarly to the case of the first preferred embodiment.

Moreover, since the metallic film 2 is provided between the lead 32 and the semiconductor chip 1 via the insulative film 3, the situation that noise is superposed on signals, such as a driving voltage and a clock signal on a transmission line, can be avoided. Furthermore, since the inductance of the signal line can be reduced by setting the metallic film 2 close to the signal line, transmission speed of the signal or data can be increased.

Table 7 shows an example of the arrangement of the solder ball terminals in a BGA package on a CSP type.

TABLE 7

EXAMPLE OF ARRANGEMENT OF BALL TERMINALS OF CSP TYPE-BGA PACKAGE

| COLUMN NUMBER OF JOINING | BALL TERMINAL OF SIGNAL/ CONTROL LINE | | BALL TERMINAL OF POWER-SOURCE/ GND LINE | |
|---|---|---|---|---|
| PORTION OF CHIP TERMINAL | COLUMN 1 | COLUMN 2 | COLUMN 3 | COLUMN 4 |
| 1 | | | | SCK |
| 2 | | | VDD | |
| 3 | DQ8 | | | |
| 4 | | DQ7 | | |
| 5 | | | | CMD |
| 6 | | | GND | |
| 7 | DQ6 | | | |
| 8 | | DQ5 | | |
| 9 | | | | GND |
| 10 | | | VDD | |
| 11 | DQ4 | | | |
| 12 | | DQ3 | | |
| 13 | | | | VDD |
| 14 | | | GND | |
| 15 | DQ2 | | | |
| 16 | | DQ1 | | |
| 17 | | | | Vterm |
| 18 | | | GND | |
| 19 | DQ0 | | | |
| 20 | | CTMN | | |
| 21 | | | | Vref |
| 22 | | | CFMN | |
| 23 | | CTM | | |
| 24 | RQ3 | | | |
| 25 | | | CFM | |
| 26 | | | | VDDa |
| 27 | | RQ1 | | |
| 28 | RQ2 | | | |
| 29 | | | GNDa | |
| 30 | | | | VDD |
| 31 | | RQ0 | | |
| 32 | DQ1 | | | |
| 33 | | | VDD | |
| 34 | | | | GND |
| 35 | | DQ0 | | |
| 36 | DQ3 | | | |
| 37 | | | GND | |
| 38 | | | | VDD |
| 39 | | DQ2 | | |
| 40 | DQ5 | | | |
| 41 | | | VDD | |
| 42 | | | | GND |
| 43 | | DQ4 | | |
| 44 | DQ7 | | | |
| 45 | | | GND | |
| 46 | | | | Sin |
| 47 | | DQ6 | | |
| 48 | DQ8 | | | |
| 49 | | | VDD | |
| 50 | | | | Sout |

In table 7, ball terminal DQ0 to DQ8 are data terminals, and the same RQ1 to RQ3 are column access control terminals.

Figure 22A:
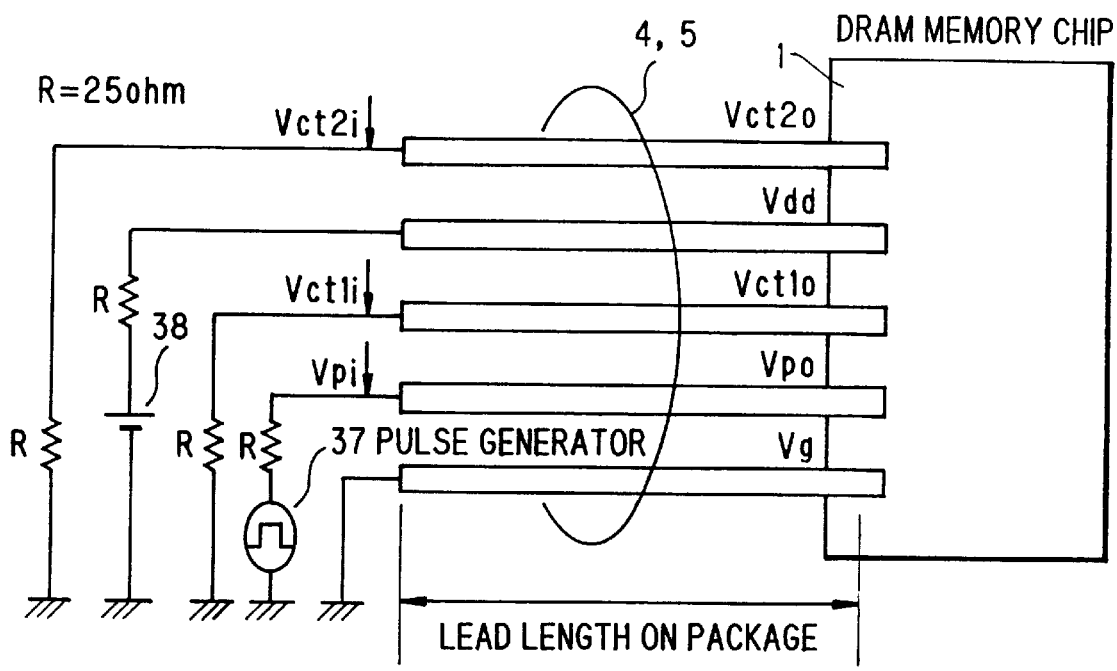
Figure 22B:
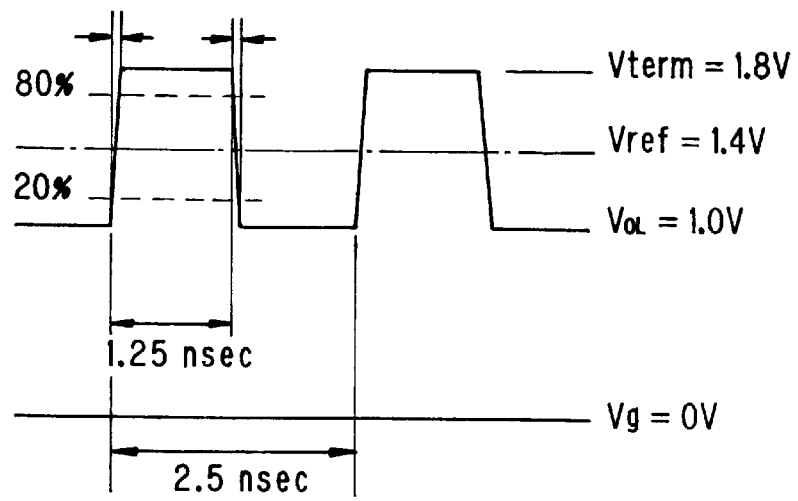
Figure 23A:
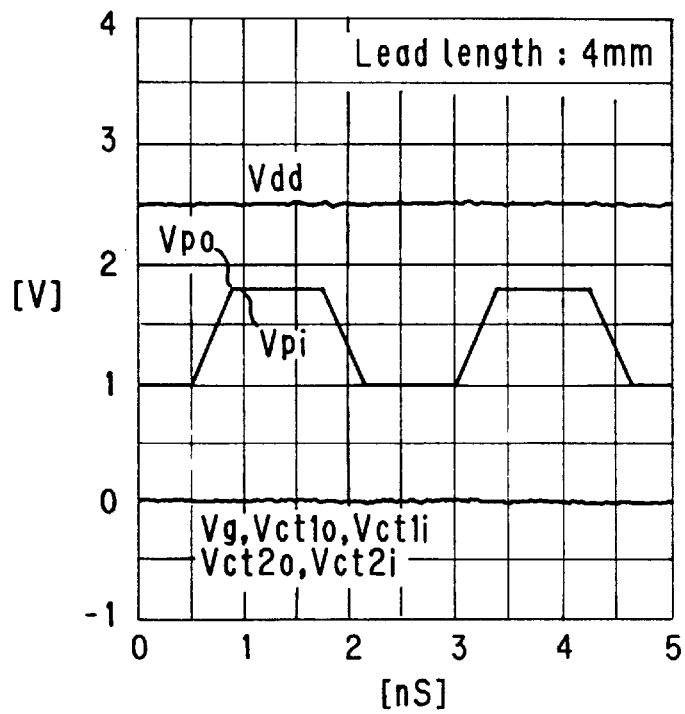
FIGS. 23A and 23B show results of computer simulation explained in FIGS. 22A and 22B.
Figure 23B:
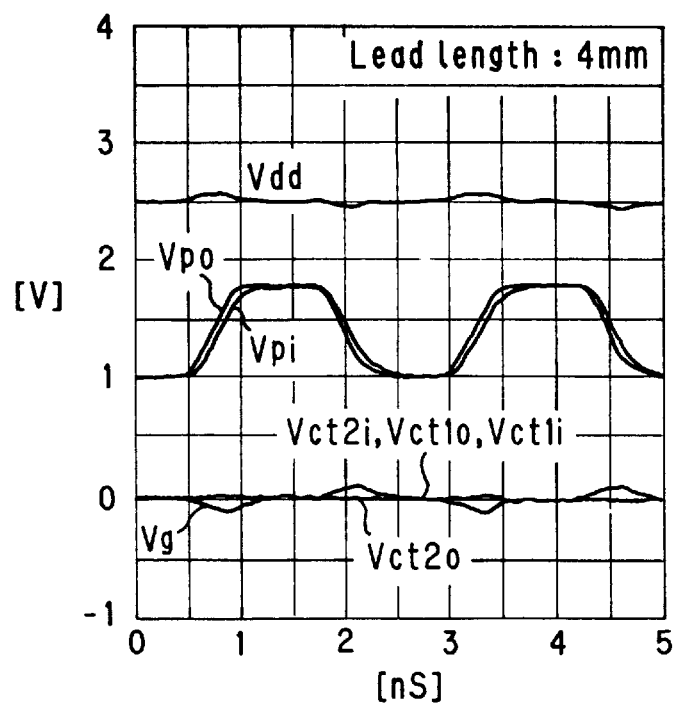

Next, an analysis of noise by a computer simulation for the case of a BGA package of a CSP type according to the fourth preferred embodiment will be explained. FIGS. 22A and 22B show the condition of the computer simulation for the case that a pulse is transmitted on the line in a package. FIG. 22A shows a signal transmission lines in the package, and FIG. 22B shows the waveform of the transmitted pulse. FIGS. 23A and 23B show the results of the computer simulation for the case of a BGA package of a CSP type, FIG. 23A shows the waveform of the pulse in case that the pulse is transmitted from a Rambus channel to the semiconductor chip, and FIG. 23B shows the waveform of the pulse in case that the pulse is transmitted from the semiconductor chip to the Rambus channel.

In FIGS. 22A and 22B, a DRAM is used as the semiconductor chip 1, and MDS (Micro Design System) software is applied with a modification so that the leads 4 and 5 on the package are fitted for the practical case, 37 is a pulse generator, R is a resistor (25 Ω) and 38 is a DC power source. $V_{ct1i}$, $V_{ct2i}$ and $V_{pi}$ are input voltages on the lead on the package. $V_{ct20}$, $V_{dd}$, $V_{ct10}$, $V_{po}$ and $V_{g}$ are input voltages of the semiconductor chip (DRAM) 1.

In FIGS. 23A and 23B, $V_g$ is a ground potential, $V_{ct10}$, $V_{ct1i}$, $V_{ct20}$, and $V_{ct2i}$ are cross talk noises on the signal lines adjacent to a signal line, on which the pulse is transmitted. $V_{po}$, and $V_{pi}$ are respectively waveform distortions caused by reflection and signal delay. $V_{dd}$ is a power source voltage. FIG. 23A shows the waveforms for case that a signal pulse is transmitted from the Rambus channel to the chip, and FIG. 23B shows those for case that the signal pulse is transmitted from the chip to the Rambus channel. The length of the lead in the package is assumed to be 4 mm for both the cases.
(The fifth preferred embodiment)

Figure 24:
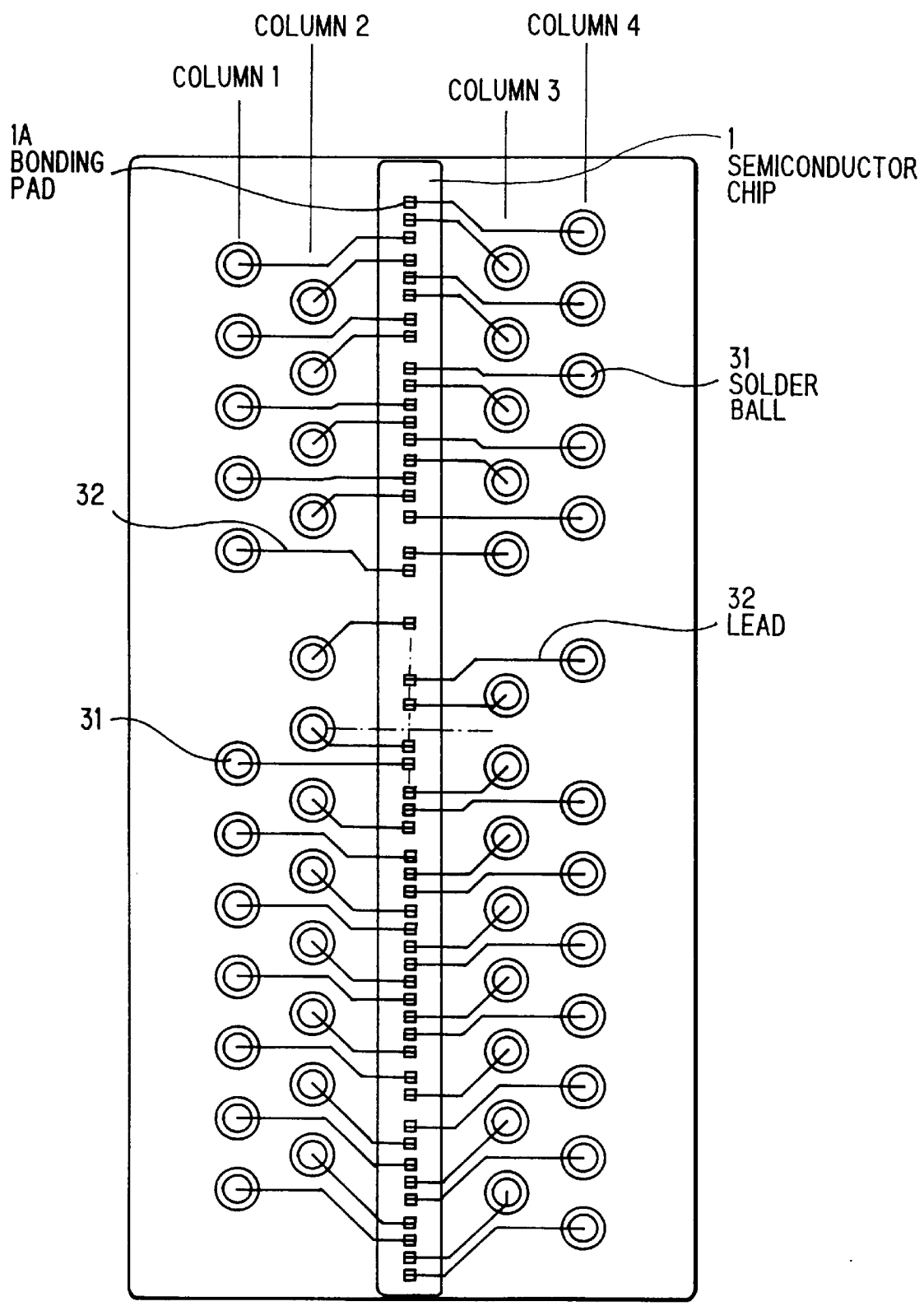
FIG. 24 is a planar view for showing an outline of a structure of a CSP type-DRAM of LOC and BGA structure according to the fifth preferred embodiment of the invention.

FIG. 24 is a planar view for showing a CPS type-DRAM of BGA and LOC structure according to the fifth preferred embodiment of the invention.

As shown FIG. 24, the CPS type-DRAM of BGA and LOC structure according to the fifth preferred embodiment of the invention can be obtained by shifting the solder balls in the first and fourth columns in the fourth preferred embodiment from those in the second and third columns by a half pitch in the longitudinal direction. According to the configuration shown in FIG. 24, wiring can be simplified, and the length of the leads to the solder balls in the first and fourth column can be shorted though the effect is small.
(The sixth preferred embodiment)

Figure 25:
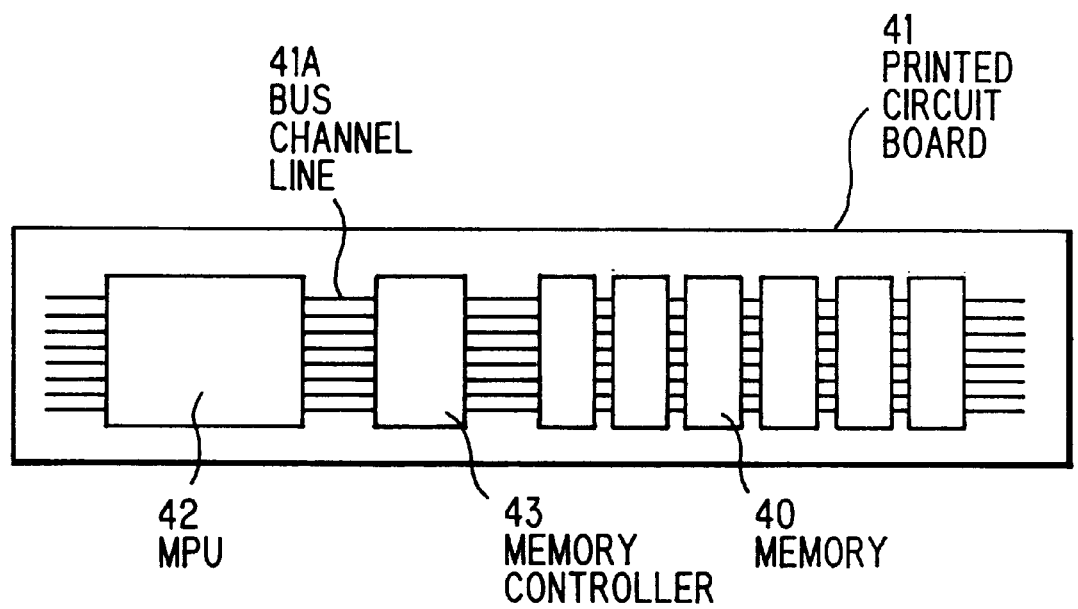
FIG. 25 is a planar view for showing an electronic device according to the sixth preferred embodiment of the invention.
Figure 26:
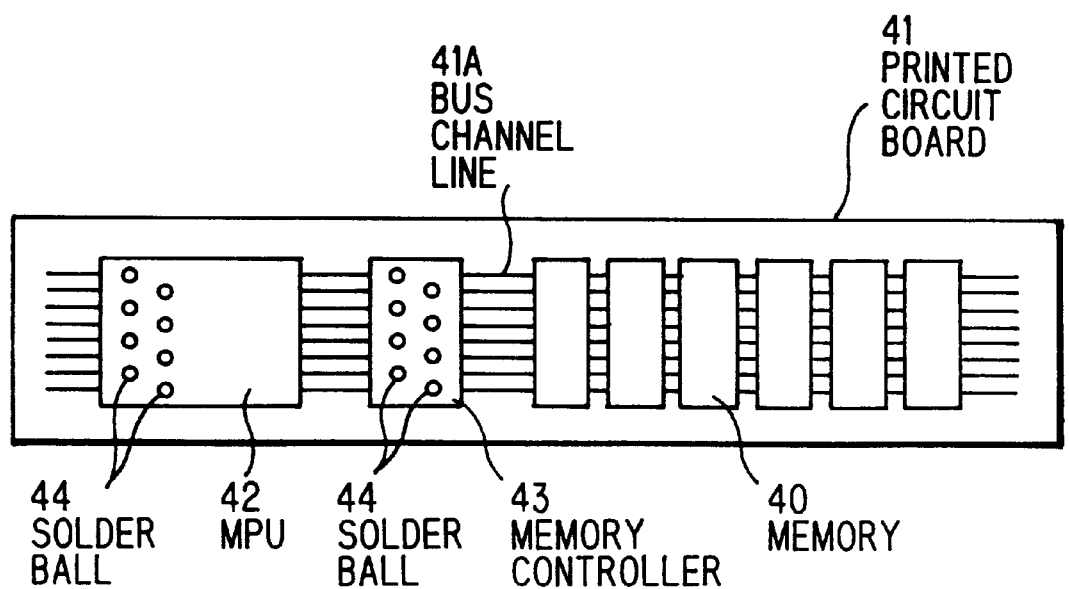
FIG. 26 is a planar view for showing an electronic device according to the sixth preferred embodiment of the invention.

FIGS. 25 and 26 show a planar view for explaining the outline of the structure of the electronic device, which mounts CSP-type DRAMs of BGA and LOC structure thereon. 40 is a memory according to the invention, 41 is a printed circuit board provided with plural bus channel lines 41A, 42 is a micro processor (MPU), 43 is a memory controller and 44 is a solder ball.

As shown in FIG. 25, in the electronic device according to the sixth preferred embodiment of the invention, the MPU 42, the memory controller 43 and the plural memories 40 are mounted on the printed circuit board 41 provided with the plural linear bus channel lines 41 running in parallel with each other.

As shown in FIG. 26, the pitch of the bus channel lines is 0.25 mm or 0.375 mm, and the pitch of the solder balls 44 electrically connected with the leads of the aforementioned memories 40 is 0.5 mm or 0.75 mm.

The solder balls 44 of the aforementioned memories 40 are alternately connected with the bus channel lines (equal length-lines) 41A, and the leads on the left and right sides are shifted by a half pitch and positioned on the bus channel lines 41A.

The balls 44 of the ball array on the MPU 42 and the memory controller 43 are alternately connected with the bus channel lines 41A also similarly to the case of the memories 40, and the leads on the left and right sides are shifted from each other by a half pitch and positioned on the bus channel lines 41A.

As mentioned in the above, since the MPU 42, the memory controller 43, the plural memories 40 are mounted on the printed circuit board 41, which is composed of the plural bus channel lines running in parallel with each other and an insulative printed circuit board, the transmission delay times of the signal lines in the transmission line provided between the semiconductor devices can be equalized.

Satisfactory results are experimentally confirmed from the aspects of electrical and mechanical characteristics on the semiconductor memory device, in which the pitch of the bus channel lines is 0.25 mm or 0.375 mm and the pitch of the external leads and that of the solder balls of a BGA electrically connected with the leads is 0.5 mm and 0.75 mm.

Especially, noise superposed on the driving voltage of the electronic device or the clock signal on the transmission is reduced, and efficiency of data processing can be improved.

Although the explanations are given on the case of the semiconductor memory device in the first to sixth preferred embodiments, it is a matter of course that the field of application of the invention is never restricted to the semiconductor memory device.

The results of the invention can be summarized as follows.

(1) In the semiconductor device of LOC structure, since the leads on the left side and those on the right side are shifted from each other by a half pitch, it becomes easy to provide the lead in the outside of the semiconductor device and the length of the lead in the package of the semiconductor device can be shortened.

(2) Since the effect of electromagnetic wave on the semiconductor device can be reduced by providing an electromagnetic shielding film, noise superposed on the driving voltage and the clock signal on the transmission line can be reduced. Moreover, since the inductance of the signal lead can be reduced by setting the electromagnetic shielding film closed to the signal lead, the transmission speed of the signal can be increased, and the efficiency of the data processing can be improved.

(3) By making the bus channel line surface of the semiconductor memory device and that of the printed circuit board be opposed to each other, the printed circuit board can be easily fabricated without making through hole.

(4) By mounting the plural semiconductor devices (especially the semiconductor memory device) on the printed circuit board, which is provided with the plural straight and parallel bus channel lines, each having an equal transmission length, the lengths of the signal lines in the bus channel lines provided between the semiconductor devices can be equalized.

Satisfactory results are obtained from the aspect of electrical and mechanical characteristics by the semiconductor device, in which the pitch of the bus channel lines is 0.25 mm or 0.375 mm and the pitch of the external leads and that of the solder balls of a BGA electrically connected with the leads is 0.5 mm or 0.75 mm.

According to the invention noise superposed on the driving voltage of the electronic device or the clock signal on the transmission line can be reduced, and the speed of the data processing of the electronic device can be increased.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A semiconductor device of LOC (Lead On Chip) type, which is provided on a bus channel line board having an insulative substrate and a plurality of parallel and straight bus channel lines, each having the same length, said semiconductor device comprising:

a semiconductor chip; and leads provided on said semiconductor chip to be connected to pads of said semiconductor chip, wherein said leads comprise left and right side leads extending towards left and right sides with respect to said pads respectively, such that said left side leads are arranged to be staggered relative to said right side leads by a half pitch of said right side leads.

2. A semiconductor device according to claim 1, further comprising;

a metallic film provided between said leads and said semiconductor chip via an insulative film.

3. A semiconductor device according to claim 1, wherein;

said right leads serve as signal leads, and said left leads serve as power source or ground leads.

4. A semiconductor device according to claim 1, wherein;

said left leads serve as signal leads, and said right leads serve as power source or ground leads.

5. A semiconductor leads according to claim 3 or 4, further comprising;

a metallic film provided between said leads and said semiconductor chip via an insulative film.

6. A semiconductor device according to claim 1, wherein;

each of said leads is connected with a solder ball in a solder ball grid array.

7. A semiconductor device according to claim 1, wherein;

said semiconductor device is a semiconductor memory device.

8. A semiconductor device according to claim 1, wherein;

each of said leads on said semiconductor device is opposed to a bus channel line on a bus channel line board.

9. An electronic device, comprising:

a bus channel line board having a plurality of parallel and straight bus channel lines, each having the same length; and semiconductor devices provided on said bus channel line board, wherein each of said semiconductor device has leads connected to said parallel and straight bus channel lines and pads of said semiconductor chip, said leads extending towards left and right side directions with respect to said pads in a staggered pattern by a half pitch of said leads.

10. An electronic device according to claim 9, wherein said semiconductor devices are composed of a plurality of memories.

11. An electronic device according to claim 9, wherein;

said semiconductor devices are composed of a microprocessor unit, a semiconductor device, a memory controller, and a plurality of memories.

12. An electronic device according to claim 9, wherein;

an interval between said adjacent bus channel lines is 0.25 mm or 0.375 mm, and a pitch of external leads of said semiconductor device or solder balls of a solder ball grid array, each being connected with said lead on said semiconductor device, is 0.5 mm or 0.75 mm.

13. An electronic device according to claim 12, wherein;

said external leads or said solder balls of said solder ball grid array are arranged so that said external leads or said solder balls are alternately connected with said bus channel lines.

* * * * *